United States Patent
Yuan et al.

(10) Patent No.: US 11,895,890 B2
(45) Date of Patent: Feb. 6, 2024

(54) DISPLAY SUBSTRATE AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Zhidong Yuan, Beijing (CN); Yongqian Li, Beijing (CN); Can Yuan, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 557 days.

(21) Appl. No.: 17/264,056

(22) PCT Filed: May 22, 2020

(86) PCT No.: PCT/CN2020/091762
§ 371 (c)(1),
(2) Date: Jan. 28, 2021

(87) PCT Pub. No.: WO2020/233698
PCT Pub. Date: Nov. 26, 2020

(65) Prior Publication Data
US 2021/0233971 A1    Jul. 29, 2021

(30) Foreign Application Priority Data
May 22, 2019  (CN) .......................... 201910431419.5

(51) Int. Cl.
*H01L 27/12*    (2006.01)
*H10K 59/35*    (2023.01)
(Continued)

(52) U.S. Cl.
CPC ......... *H10K 59/353* (2023.02); *H10K 59/123* (2023.02); *H10K 59/1213* (2023.02);
(Continued)

(58) Field of Classification Search
CPC ............. H10K 59/353; H10K 59/1213; H10K 59/1216; H10K 59/123; H10K 59/131;
(Continued)

(56) References Cited

U.S. PATENT DOCUMENTS

2008/0001525 A1    1/2008  Chao et al.
2012/0056531 A1    3/2012  Park et al.
(Continued)

FOREIGN PATENT DOCUMENTS

CN    107146804    9/2017
CN    107910348    4/2018
(Continued)

OTHER PUBLICATIONS

International Search Report (w/ English Translation) for corresponding PCT Application No. PCT/CN2020/091762 dated Aug. 27, 2020, 7 pages.
(Continued)

*Primary Examiner* — Elias Ullah
(74) *Attorney, Agent, or Firm* — Dority & Manning, P.A.

(57) ABSTRACT

A display substrate includes a first base and a plurality of pixel units arranged in rows and in columns. A pixel unit includes a first light-emitting device, a second light-emitting device and a third light-emitting device. A first effective light-emitting area where the first light-emitting device is located and a second effective light-emitting area where the second light-emitting device is located are arranged at intervals along a first direction, a third effective light-emitting area where the third light-emitting device is located is spaced apart from both the first effective light-emitting
(Continued)

area and the second effective light-emitting area arranged along a second direction. A minimum distance between the first effective light-emitting area and the second effective light-emitting area along the first direction is less than a minimum distance between the third effective light-emitting area and both the first effective light-emitting area and the second effective light-emitting area along the second direction.

20 Claims, 18 Drawing Sheets

(51) Int. Cl.
  *H10K 59/123* (2023.01)
  *H10K 59/131* (2023.01)
  *H10K 59/121* (2023.01)
  *H10K 50/86* (2023.01)
  *H10K 50/842* (2023.01)
  *H10K 59/38* (2023.01)

(52) U.S. Cl.
  CPC ....... *H10K 59/1216* (2023.02); *H10K 59/131* (2023.02); *H01L 27/1214* (2013.01); *H10K 50/8428* (2023.02); *H10K 50/865* (2023.02); *H10K 59/38* (2023.02)

(58) Field of Classification Search
  CPC .. H10K 50/8428; H10K 50/865; H10K 59/38; H10K 50/86; H10K 59/122; H01L 27/1214
  See application file for complete search history.

(56) References Cited

U.S. PATENT DOCUMENTS

| | | |
|---|---|---|
| 2014/0111115 A1 | 4/2014 | Bai et al. |
| 2014/0292622 A1 | 10/2014 | Lee |
| 2016/0240592 A1 | 8/2016 | Li et al. |
| 2017/0012094 A1 | 1/2017 | Lee |
| 2018/0183008 A1 | 6/2018 | Song et al. |

FOREIGN PATENT DOCUMENTS

| | | |
|---|---|---|
| CN | 108258022 | 7/2018 |
| CN | 110098243 | 8/2019 |

OTHER PUBLICATIONS

First Chinese Office Action (w/ English Translation) for corresponding Chinese Application No. 201910431419.5, 14 pages.
Second Chinese Office Action (w/ English Translation) for corresponding Chinese Application No. 201910431419.5, 10 pages.

DISPLAY SUBSTRATE AND DISPLAY APPARATUS

CROSS-REFERENCE TO RELATED APPLICATIONS

This application is a national phase entry under 35 USC 371 of International Patent Application No. PCT/CN2020/091762 filed on May 22, 2020, which claims priority to and the benefit of Chinese Patent Application No. 201910431419.5, filed on May 22, 2019, which are incorporated herein by reference in their entirety.

TECHNICAL FIELD

The present disclosure relates to the field of display technologies, and in particular, to a display substrate and a display apparatus.

BACKGROUND

Active-matrix organic light-emitting diode (AMOLED) display panels are expected to replace liquid crystal display panels and become a mainstream choice for next-generation displays due to their advantages such as high contrast, wide viewing angle and quick response. Among them, organic light-emitting diode display panels with a top emission structure have a high aperture ratio, and are thus more suitable for high-resolution products. Being better able to adapt to trends of markets, organic light-emitting diode display panels are widely used in the market.

SUMMARY

In one aspect, embodiments of the present disclosure provide a display substrate. The display substrate includes a first base and a plurality of pixel units disposed on the first base. The plurality of pixel units are arranged in rows along a first direction and in columns along a second direction. A pixel unit in the plurality of pixel units has a first effective light-emitting area, a second effective light-emitting area and a third effective light-emitting area. The pixel unit includes a plurality of light-emitting devices. The plurality of light-emitting devices include a first light-emitting device, a second light-emitting device and a third light-emitting device. A portion of the first light-emitting device is disposed in the first effective light-emitting area, a portion of the second light-emitting device is disposed in the second effective light-emitting area, and a portion of the third light-emitting device is disposed in the third effective light-emitting area. The first light-emitting device, the second light-emitting device and the third light-emitting device are configured to emit light of three primary colors, respectively. The first effective light-emitting area and the second effective light-emitting area are arranged at intervals along the first direction, and the third effective light-emitting area is spaced apart from both the first effective light-emitting area and the second effective light-emitting area along the second direction. A minimum distance between the first effective light-emitting area and the second effective light-emitting area along the first direction is less than a minimum distance between the third effective light-emitting area and both the first effective light-emitting area and the second effective light-emitting area along the second direction.

In some embodiments, the minimum distance between the first effective light-emitting area and the second effective light-emitting area is approximately 10 μm to approximately 20 μm, and the minimum distance between the third effective light-emitting area and both the first effective light-emitting area and the second effective light-emitting is approximately 20 μm to approximately 25 μm.

In some embodiments, the third light-emitting device is configured to emit green light; and the first light-emitting device and the second light-emitting device are configured to emit red light and blue light respectively.

In some embodiments, the first light-emitting device includes a first anode, a first light-emitting functional layer and a first cathode; the second light-emitting device includes a second anode, a second light-emitting functional layer and a second cathode; and the third light-emitting device includes a third anode, a third light-emitting functional layer and a third cathode. The pixel unit further includes a plurality of pixel driver circuits. The first anode, the second anode and the third anode are each connected to a corresponding pixel driver circuit, and a pixel driver circuit is configured to drive a corresponding light-emitting device to emit light. The pixel driver circuit includes a storage capacitor. Orthographic projections of all storage capacitors in the pixel unit on the first base are located between an orthographic projection of the third effective light-emitting area on the first base and orthographic projections of the first effective light-emitting area and the second effective light-emitting area on the first base.

In some embodiments, the display substrate has a display area. The display area includes a plurality of pixel areas, and an area where the pixel unit is located is a pixel area. The pixel area includes a first sub-area, a second sub-area and a third sub-area that are arranged sequentially along the first direction, and each of the first sub-area, the second sub-area and the third sub-area is provided with a pixel driver circuit therein. The first anode is disposed in the first sub-area and the second sub-area and is connected to a pixel driver circuit provided in the second sub-area; the second anode is disposed at least in the third sub-area and is connected to a pixel driver circuit provided in the third sub-area; the third anode is disposed in the first sub-area, the second sub-area and the third sub-area, and is connected to a pixel driver circuit provided in the first sub-area.

In some embodiments, the second anode further extends to the second sub-area.

In some embodiments, the first anode is connected to the pixel driver circuit provided in the second sub-area through a first via hole, the second anode is connected to the pixel driver circuit provided in the third sub-area through a second via hole, and the third anode is connected to the pixel driver circuit provided in the first sub-area through a third via hole. Orthographic projections of the first via hole, the second via hole and the third via hole on the first base are each located between the orthographic projection of the third effective light-emitting area on the first base and the orthographic projections of the first effective light-emitting area and the second effective light-emitting area on the first base.

In some embodiments, geometric centers of the orthographic projections of the first via hole, the second via hole and the third via hole in the pixel unit on the first base are on a same straight line along the first direction.

In some embodiments, the display substrate further includes a plurality of first data lines, a plurality of second data lines and a plurality of third data lines that are disposed on the first base. The plurality of first data lines, the plurality of second data lines and the plurality of third data lines all extend along the second direction. A first data line and a second data line are disposed between the first sub-area and the second sub-area; the first data line is connected to the pixel driver circuit located in the first sub-area, and the second data line is connected to the pixel driver circuit located in the second sub-area. A third data line is disposed between the second sub-area and the third sub-area, and the third data line is connected to the pixel driver circuit located in the third sub-area.

In some embodiments, the display substrate further includes a plurality of first gate lines, a plurality of first voltage lines and a plurality of second voltage lines. The plurality of first gate lines all extend along the first direction, and the plurality of first voltage lines and the plurality of second voltage lines all extend along the second direction. The pixel driver circuit in each of the first sub-area, the second sub-area and the third sub-area includes a first transistor, a driving transistor and a storage capacitor. The storage capacitor includes a first storage electrode and a second storage electrode. A gate of the first transistor is connected to a first gate line corresponding to the pixel driver circuit; a second electrode of the first transistor is connected to a gate of the driving transistor; a first electrode of a first transistor located in the first sub-area is connected to the first data line, a first electrode of a first transistor located in the second sub-area is connected to the second data line, and a first electrode of a first transistor located in the third sub-area is connected to the third data line. A first electrode of the driving transistor is connected to a first voltage line corresponding to the pixel driver circuit, and a second electrode of the driving transistor is connected to the first storage electrode. A first storage electrode of the storage capacitor in the first sub-area is connected to the third anode through the third via hole, a first storage electrode of the storage capacitor in the second sub-area is connected to the first anode through the first via hole, and a first storage electrode of the storage capacitor in the third sub-area is connected to the second anode through the second via hole. The first cathode, the second cathode and the third cathode are connected to a second voltage line through at least one fourth via hole.

The second storage electrode is connected to the gate of the driving transistor. The orthographic projections of the first via hole, the second via hole and the third via hole on the first base overlap with orthographic projections of corresponding storage capacitors on the first base respectively.

In some embodiments, the driving transistor further includes an active pattern, and the active pattern is disposed on a side of the gate of the driving transistor proximate to the first base. The first storage electrode is disposed in a same layer as the first electrode and the second electrode of the driving transistor; and the second storage electrode is disposed in a same layer as the active pattern of the driving transistor.

In some embodiments, the gate of the first transistor is a portion of a corresponding first gate line located in a region where the first transistor is located.

In some embodiments, along the first direction, every two adjacent pixel units constitute a pixel group, and the two pixel units of each pixel group are a first pixel unit and a second pixel unit. A second voltage line is disposed between the first pixel unit and the second pixel unit in the pixel group; and along the first direction, a first voltage line is disposed between two adjacent pixel groups.

In some embodiments, the pixel driver circuit further includes a second transistor. The display substrate further includes a plurality of second gate lines and a plurality of sensing signal lines. The plurality of second gate lines extend along the first direction, and the plurality of sensing signal lines extend along the second direction. A sensing signal line is disposed between the first pixel unit and the second pixel unit in the pixel group. A gate of the second transistor is connected to a corresponding second gate line; a first electrode of the second transistor is connected to a corresponding sensing signal line, and a second electrode of the second transistor is connected to the first storage electrode.

In some embodiments, the gate of the second transistor is a portion of a corresponding second gate line located in a region where the second transistor is located.

In some embodiments, an orthographic projection of the third light-emitting device on the first base has an overlapping area with orthographic projections of the second transistors located in the first to third sub-areas on the first base.

In some embodiments, an orthographic projection of the second light-emitting device in the first pixel unit of the pixel group on the first base has an overlapping area with orthographic projections of the second voltage line and the sensing data line on the first base; and an orthographic projection of the second light-emitting device in the second pixel unit of the pixel group on the first base has an overlapping area with an orthographic projection of the first voltage line on the first base.

In some embodiments, the plurality of first data lines, the plurality of second data lines, the plurality of third data lines, the plurality of first voltage lines, the plurality of second voltage lines and the plurality of sensing data lines are disposed in a same layer.

In some embodiments, the first effective light-emitting area and the second effective light-emitting area are symmetrical with respect to a central axis of the third effective light-emitting area along the second direction.

In another aspect, embodiments of the present disclosure provide a display apparatus. The display apparatus includes the display substrate described above, and further includes a color filter substrate. The color filter substrate includes a second base and a color filter layer disposed on a side of the second base facing the first base. The color filter layer includes a plurality of first color filter units, a plurality of second color filter units and a plurality of third color filter units. A portion of a black matrix is disposed between two adjacent filter units. An orthographic projection of each first color filter unit on the second base overlaps with an orthographic projection of a corresponding first light-emitting device on the second base, an orthographic projection of each second color filter unit on the second base overlaps with an orthographic projection of a corresponding second light-emitting device on the second base, and an orthographic projection of each third color filter unit on the second base overlaps with an orthographic projection of a corresponding third light-emitting device on the second base.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other accompanying drawings according to these drawings. In addition, the accompanying drawings to be described below may be regarded as schematic diagrams, and are not limitations on actual sizes of products, actual processes of methods and actual timings of signals to which the embodiments of the present disclosure relate.

FIG. 1A is a top view illustrating a structure of a display substrate, in accordance with some embodiments of the present disclosure.

DETAILED DESCRIPTION

Technical solutions in some embodiments of the present disclosure will be described below clearly and completely with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising" throughout the description and the claims are construed as an open and inclusive, i.e., "including, but not limited to". In the description of the specification, terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, terms such as "first" and "second" are used for descriptive purposes only, and are not to be construed as indicating or implying the relative importance or implicitly indicating the number of indicated technical features. Thus, features defined as "first" or "second" may explicitly or implicitly include one or more of the features. In the description of the embodiments of the present disclosure, the term "a plurality of" and "the plurality of" each means two or more unless otherwise specified.

In the description of some embodiments, the term "connected" and its derivatives may be used. For example, the term "connected" may be used in the description of some embodiments to indicate that two or more elements are in direct physical contact or electric contact with each other. The embodiments disclosed herein are not necessarily limited to the content herein.

Figure 1A:
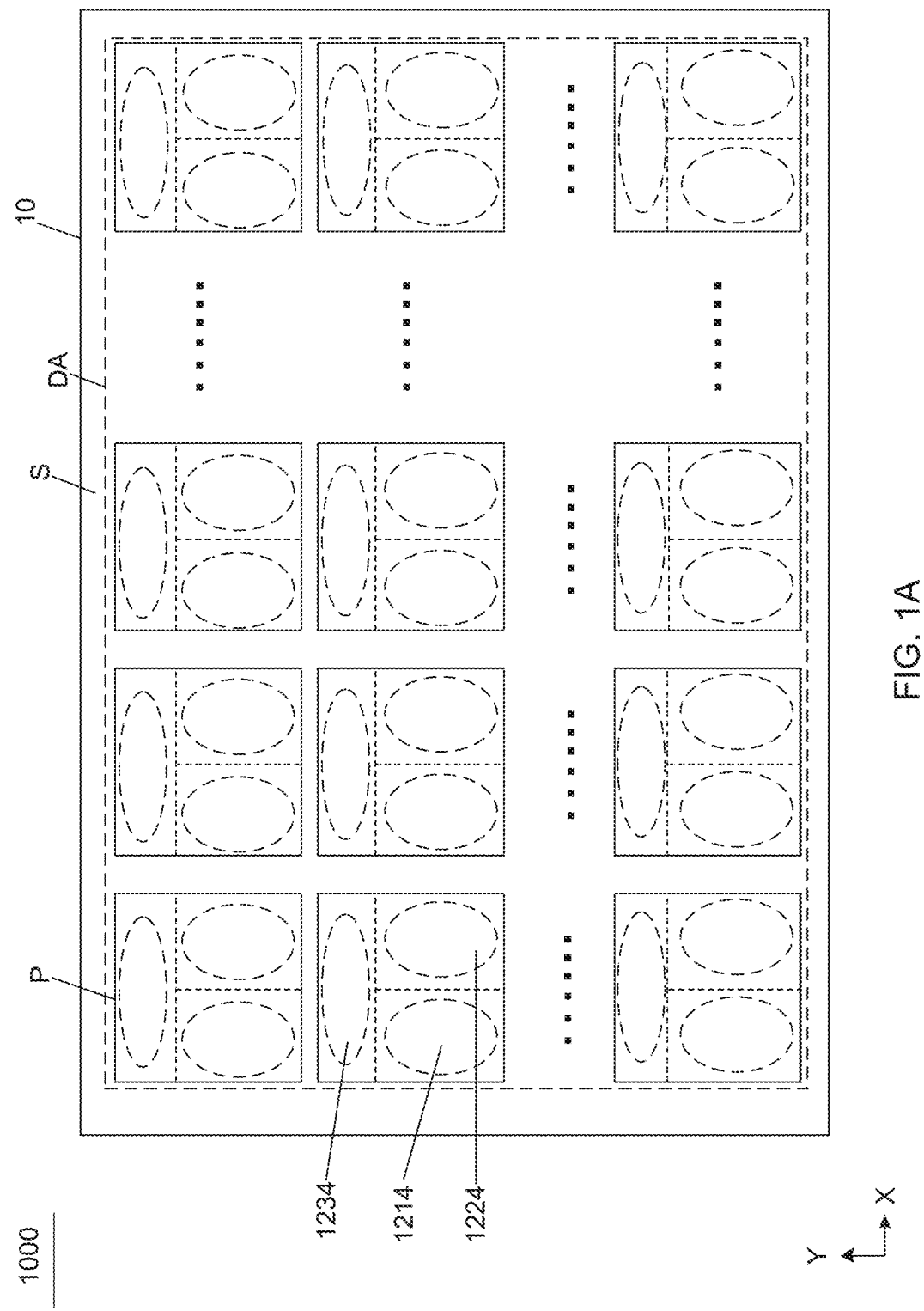
FIG. 1B is a diagram illustrating a structure of a display substrate, in accordance with some embodiments of the present disclosure.
Figure 1B:
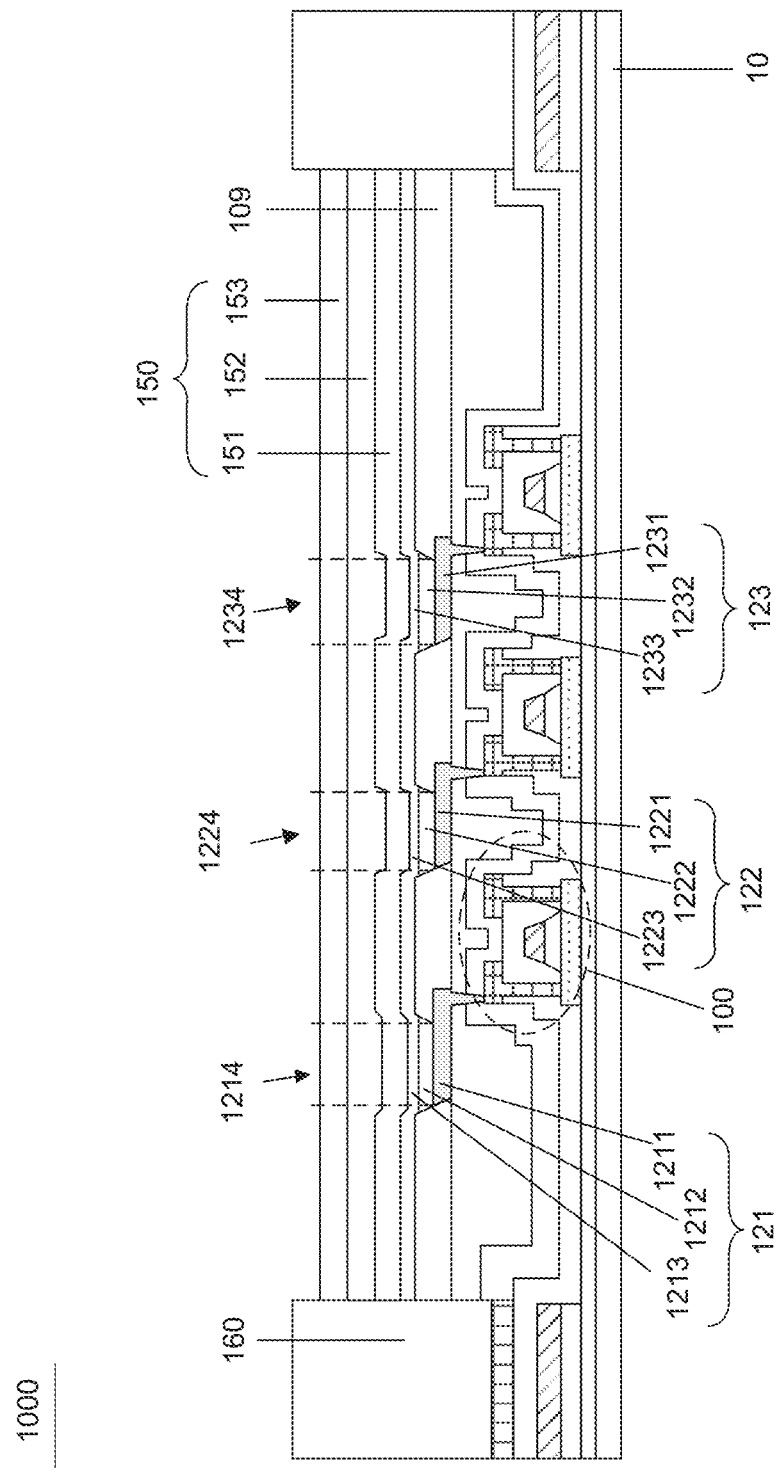

Some embodiments of the present disclosure provide a display apparatus. The display apparatus is, for example, a display panel, a cellphone, a tablet computer, a personal digital assistant (PDA), or a vehicle-mounted computer. As shown in FIGS. 1A and 1B, the display apparatus includes a display substrate 1000.

As shown in FIG. 1A, the display substrate 1000 has a display area DA and a peripheral area S. The peripheral area S is disposed, for example, around the display area DA. The peripheral area S is used for wiring. Moreover, the peripheral area S may be provided with at least one driver circuit (e.g., a gate driver circuit) therein.

As shown in FIG. 1A, the display substrate 1000 includes a first base 10 and a plurality of pixel units P disposed on the first base 10 and located in the display area DA. The plurality of pixel units P are arranged in rows and in columns. A pixel unit P of the plurality of pixel units P includes a plurality of light-emitting devices. For example, each pixel unit P includes a plurality of light-emitting devices.

As shown in FIG. 1B, the pixel unit P has a first effective light-emitting area 1214, a second effective light-emitting area 1224 and a third effective light-emitting area 1234. The plurality of light-emitting devices include a first light-emitting device 121, a second light-emitting device 122 and a third light-emitting device 123. A portion of the first light-emitting device 121 is disposed in the first effective light-emitting area 1214, a portion of the second light-emitting device 122 is disposed in the second effective light-emitting area 1224, and a portion of the third light-emitting device 123 is disposed in the third effective light-emitting area 1234.

The first light-emitting device 121, the second light-emitting device 122 and the third light-emitting device 123 are used to emit light of three primary colors.

For example, the light of three primary colors emitted by the first light-emitting device 121, the second light-emitting device 122 and the third light-emitting device 123 are red light, green light and blue light, respectively. Or, in some embodiments, the light of three primary colors emitted by the first light-emitting device 121, the second light-emitting device 122 and the third light-emitting device 123 may also be cyan light, magenta light and yellow light, respectively.

In some embodiments, as shown in FIG. 1B, the first light-emitting device 121 includes a first anode 1211, a first light-emitting functional layer 1212 and a first cathode 1213; the second light-emitting device 122 includes a second anode 1221, a second light-emitting functional layer 1222 and a second cathode 1223; and the third light-emitting device 123 includes a third anode 1231, a third light-emitting functional layer 1232 and a third cathode 1233.

As shown in FIG. 1B, the display substrate 1000 further includes a pixel defining layer 109. The pixel defining layer 109 is in a shape of a grid. Each opening of the grid is an effective light-emitting area. That is, three effective light-emitting areas in an area where the pixel unit P is located are the first effective light-emitting area 1214, the second effective light-emitting area 1224 and the third effective light-emitting area 1234.

As shown in FIG. 1A, the first effective light-emitting area 1214 and the second effective light-emitting area 1224 are arranged at intervals along a first direction X, and the third effective light-emitting area 1234 is spaced apart from both the first effective light-emitting area 1214 and the second effective light-emitting area 1224 along a second direction Y. A minimum distance between the first effective light-emitting area 1214 and the second effective light-emitting area 1224 is less than a minimum distance between the third effective light-emitting area 1234 and both the first effective light-emitting area 1214 and the second effective light-emitting area 1224. The first direction X is parallel to a row direction that the plurality of pixel units P are arranged, and the second direction Y is parallel to a column direction that the plurality of pixel units P are arranged.

For example, as shown in FIG. 1B, the first cathodes 1213, the second cathodes 1223 and the third cathodes 1233 of all the pixel units P form an integrated cathode layer.

For another example, the first anodes 1211, the second anodes 1221 and the third anodes 1231 of all the pixel units P are disposed in a same layer, and the first anodes 1211, the second anodes 1221 and the third anodes 1231 are located in an anode layer.

In some examples, each of the first light-emitting functional layer 1212, the second light-emitting functional layer 1222 and the third light-emitting functional layer 1232 includes a light-emitting layer. Those skilled in the art will understand that, in a case where light emitted from the first light-emitting functional layer 1212, the second light-emitting functional layer 1222 and the third light-emitting functional layer 1232 has different colors, materials of light-emitting layers in the first light-emitting functional layer 1212, the second light-emitting functional layer 1222 and the third light-emitting layer 1232 are different.

In some other examples, in addition to the light-emitting layer, each of the first light-emitting functional layer 1212, the second light-emitting functional layer 1222 and the third light-emitting functional layer 1232 further includes an electron transporting layer (short for ETL), an electron injection layer (short for EIL), a hole transporting layer (short for HTL) and a hole injection layer (short for HIL). With the first light-emitting functional layer 1212 as an example, the electron transporting layer and the electron injection layer are disposed between the light-emitting layer (referred to as a first light-emitting layer) and the first cathode 1213, and the electron injection layer is closer to the first cathode 1213 than the electron transporting layer. The hole transporting layer and the hole injection layer are disposed between the first light-emitting layer and the first anode 1211, and the hole injection layer is closer to the first anode 1211 than the hole transporting layer. Structures of the second light-emitting functional layer 1222 and the third light-emitting functional layer 1232 are similar, and will not be repeated here.

Based on this, light-emitting layers in all light-emitting devices may be located in a same layer. Electron transporting layers in all light-emitting devices may be located in a same layer, electron injection layers in all light-emitting devices may be located in a same layer, hole transporting layers in all light-emitting devices may be located in a same layer, and hole injection layers in all light-emitting devices may be located in a same layer.

The light-emitting layer is, for example, an organic light-emitting layer. Based on this, the light-emitting device is an organic light-emitting diode (OLED).

The light-emitting device is, for example, a top emission light-emitting device. In this case, light emitted by the light-emitting device exits from a side away from the first base 10. The anode layer is opaque, and is, for example, a stacked structure (i.e., ITO/Ag/ITO) composed of a layer of Indium Tin Oxide (ITO), a layer of silver (Ag) and another layer of ITO, so as to reflect a portion of light emitted by the light-emitting layer and directed to the anode layer, thereby improving a light exiting rate of the light-emitting device. The cathode layer is transparent or translucent, and is, for example, a thin layer of silver, so as to transmit the light emitted by the light-emitting layer.

In some embodiments, as shown in FIG. 1B, the display substrate 1000 further includes a thin film encapsulation layer 150 located in the display area DA and disposed on a side of the light-emitting device away from the first base 10. For example, the thin film encapsulation layer 150 includes a first inorganic encapsulation layer 151, an organic encapsulation layer 152, and a second inorganic encapsulation layer 153 that are stacked, and the organic encapsulation layer 152 is located between the first inorganic encapsulation layer 151 and the second inorganic encapsulation layer 153.

In some embodiments, as shown in FIG. 1B, the display substrate 1000 further includes a barrier 160 located in the peripheral area S and around the display area DA. Since organic materials have a certain fluidity in a process of preparing the thin film encapsulation layer 150, in order to facilitate the preparing of the organic encapsulation layer by using the organic materials, the barrier 160 is provided to prevent the organic materials from flowing to edges of the display substrate 1000. In addition, the barrier 160 also have functions of blocking water and oxygen, thus preventing water and oxygen in environment from entering the display area DA from sides of the display substrate 1000.

Figure 3:
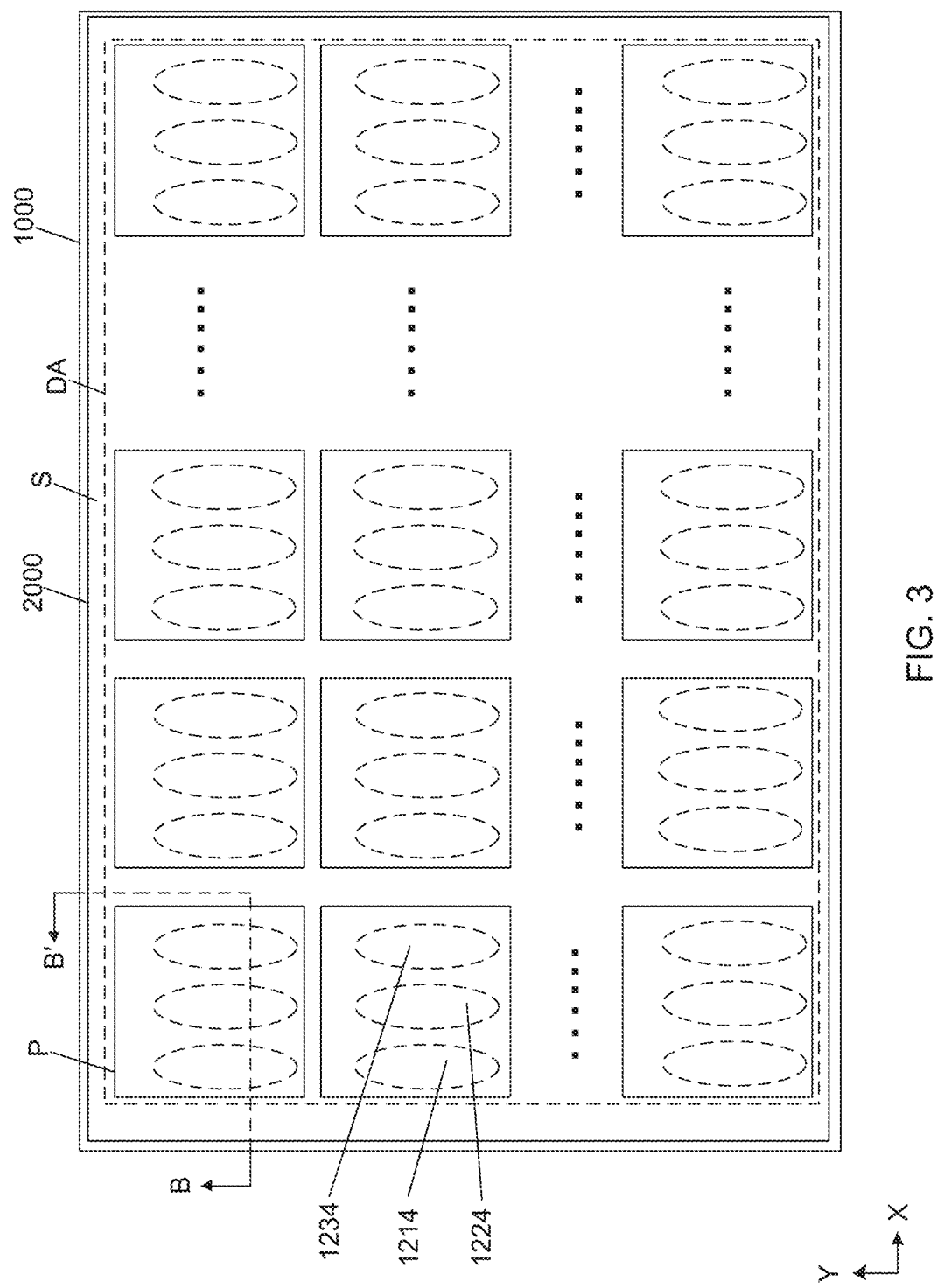
FIG. 3 is a top view illustrating a structure of a display apparatus, in accordance with the related art.
Figure 4:
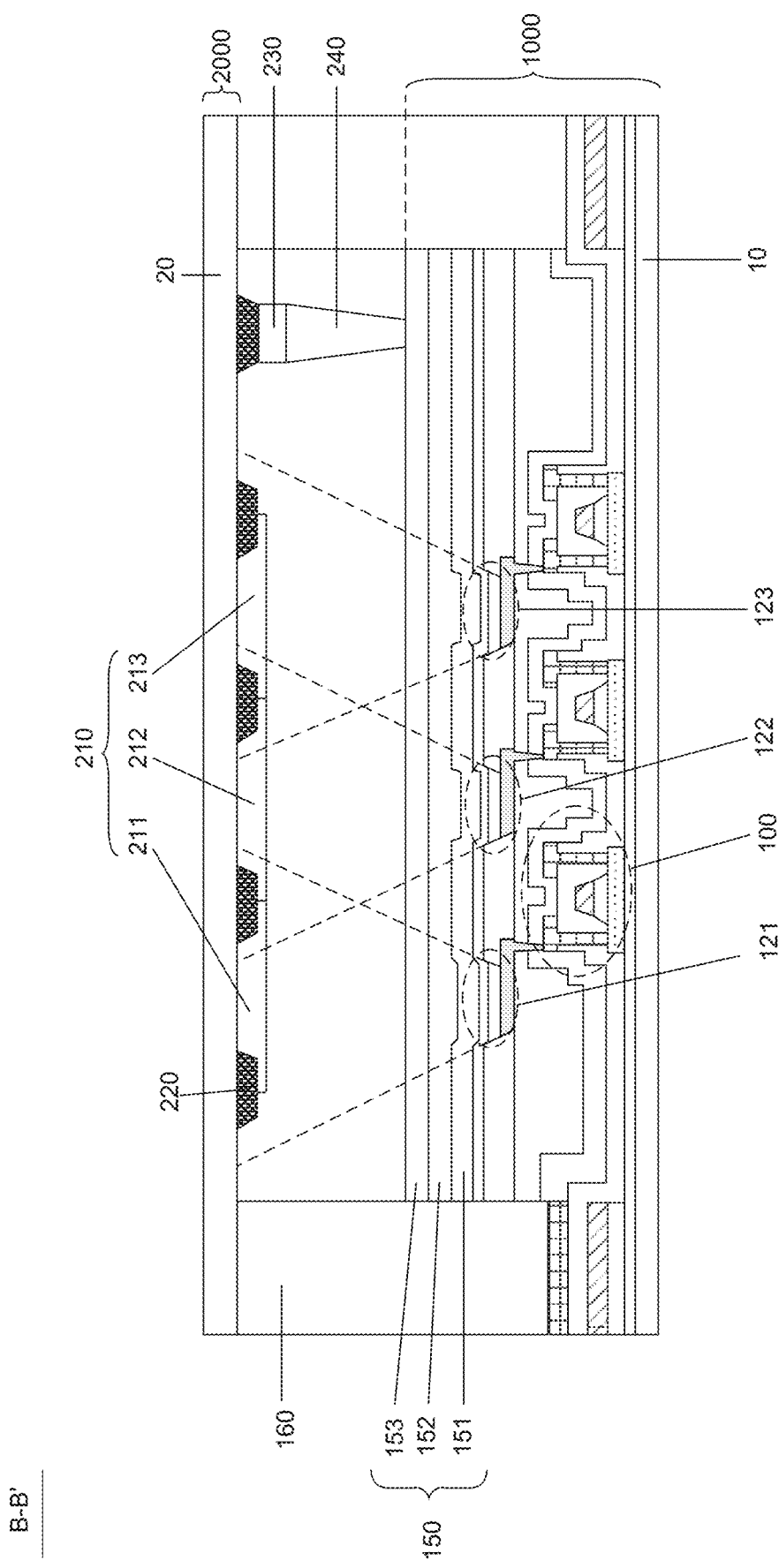
FIG. 4 is a sectional view illustrating a structure of the display apparatus taken along the B-B' direction in FIG. 3, in the related art.

In the related art, as shown in FIG. 3, the first effective light-emitting area 1214, the second effective light-emitting area 1224, and the third effective light-emitting area 1234 in the display substrate 1000 are arranged sequentially and periodically along the first direction X, and a distance between the first effective light-emitting area 1214 and the second effective light-emitting area 1224 is equal to a distance between the second effective light-emitting area 1224 and the third effective light-emitting area 1234. As shown in FIG. 3, in a case where the display substrate 1000 is applied to a display apparatus and the display apparatus further includes a color filter substrate 2000 provided on a light-exiting side of the display substrate 1000, as shown in FIG. 4, since the barrier 160 in the display substrate 1000 is very thick (its thickness may reach 11.4 μm), the first light-emitting device 121, the second light-emitting device 122 and the third light-emitting device 123 are far away from a color filter layer 210 in the color filter substrate 2000. As a result, the light emitted by the first light-emitting device 121, the second light-emitting device 122 and the third light-emitting device 123 needs to travel a long distance to reach the color filter layer 210. Based on this, as shown in FIG. 4, with three adjacent light-emitting devices as an example, a portion of light emitted by the second light-emitting device 122 (shown by straight dotted lines in FIG. 4) may reach a first color filter unit 211 and a third color filter unit 213 in the color layer, a portion of light emitted by the first light-emitting device 121 may reach a second color filter unit 212, and a portion of light emitted by the third light-emitting device 123 may reach the second color filter unit 212. Transmittances of filter units of different colors in the color filter layer 210 for light of other colors are different from a transmittance thereof for the light of its own color. In a case where a filter unit of a certain color has a higher transmittance for light of other colors, it is possible to cause color mixing problem and affect display quality of the display apparatus.

In the display substrate 1000 provided by some embodiments of the present disclosure, the first effective light-emitting area 1214 and the second effective light-emitting area 1224 in the pixel unit P are arranged at intervals along the first direction X, and the third effective light-emitting area 1234 is spaced apart from both the first effective light-emitting area 1214 and the second effective light-emitting area 1224 along the second direction Y. The minimum distance between the first effective light-emitting area 1214 and the second effective light-emitting area 1224 is less than the minimum distance between the third effective light-emitting area 1234 and both the first effective light-emitting area 1214 and the second effective light-emitting area 1224. In this way, in a case where the display substrate 1000 is applied to a display apparatus, and a filter unit of a certain color has a higher transmittance for light of other colors except for light of its own color, a light-emitting device that emits the same color of light as the color of the filter unit is used as the third light-emitting device 123 to reduce the light of other colors that reaches the color filter unit. Thus, by changing an arrangement of the first light-emitting device 121, the second light-emitting device 122 and the third light-emitting device 123 in the pixel unit P, it may be possible to alleviate the color mixing problem and thus improve the display quality of the display substrate.

In some embodiments, the minimum distance between the first effective light-emitting area 1214 and the second effective light-emitting area 1224 is approximately 10 μm to approximately 20 μm. For example, the minimum distance between the first effective light-emitting area 1214 and the second effective light-emitting area 1224 is 10 μm, 11 μm, 12 μm, 13 μm, 15 μm, 17 μm, or 20 μm. The minimum distance between the third effective light-emitting area 1234 and both the first effective light-emitting area 1214 and the second effective light-emitting area 1224 along the second direction Y is approximately 20 μm to approximately 25 μm. For example, the minimum distance between the third effective light-emitting area 1234 and both the first effective light-emitting area 1214 and the second effective light-emitting area 1224 is 20 μm, 21 μm, 22 μm, 23 μm, 24 μm, or 25 μm.

In some examples, the minimum distance between the first effective light-emitting area 1214 and the second effective light-emitting area 1224 is 10 μm, and the minimum distance between the third effective light-emitting area 1234 and both the first effective light-emitting area 1214 and the second effective light-emitting area 1224 is approximately 20 μm.

In some embodiments, the third light-emitting device 123 is configured to emit green light, and the first light-emitting device 121 and the second light-emitting device 122 are configured to emit red light and blue light, respectively.

In the color layer 210, since a green filter unit's transmittance of light other than green light is greater than a red filter unit's transmittance of light other than red light and a blue filter unit's transmittance of light other than blue light, when the red light and the blue light reach the green filter unit, a part of the red light and the blue light may pass through the green filter unit. In the display substrate 1000 provided by some embodiments of the present disclosure, the third light-emitting device 123 in the pixel unit P is configured to emit green light, and along the second direction Y, a distance between the third effective light-emitting area 1234 and both the first effective light-emitting area 1214 and the second effective light-emitting area 1224 is very large. Therefore, the red light and the blue light respectively emitted by the first light-emitting device 121 and the second light-emitting device 122 that reach the green filter unit may be reduced, and the color mixing problem may be alleviated.

In some embodiments, as shown in FIG. 1B, the pixel unit P further includes a plurality of pixel driver circuits 100. The first anode 1211, the second anode 1221 and the third anode 1231 in the pixel unit P are each connected to a corresponding pixel driver circuit 100, and the pixel driver circuit 100 is configured to drive a corresponding light-emitting device to emit light. For example, each pixel driver circuit 100 includes a plurality of transistors and a storage capacitor.

It will be noted that, FIG. 1B only illustrates one transistor in the pixel driver circuit 100, but the pixel driver circuit may include a plurality of transistors in embodiments of the present disclosure.

Figure 5A:
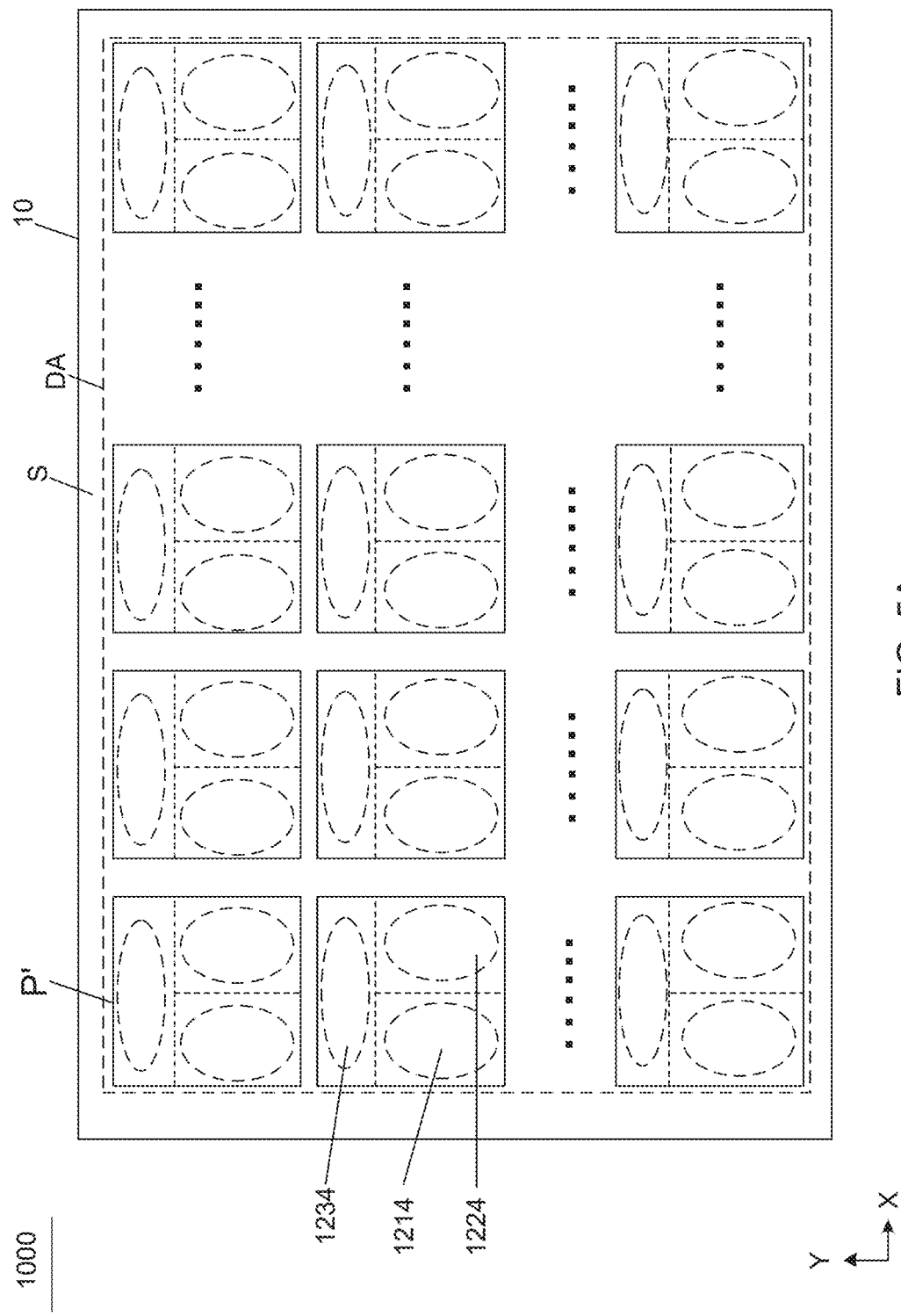
FIG. 5A is a top view illustrating a structure of a display substrate, in accordance with some embodiments of the present disclosure.

In some embodiments, as shown in FIG. 5A, the display area DA includes a plurality of pixel areas P', and an area where each pixel unit P is located is a pixel area P'.

Figure 5B:
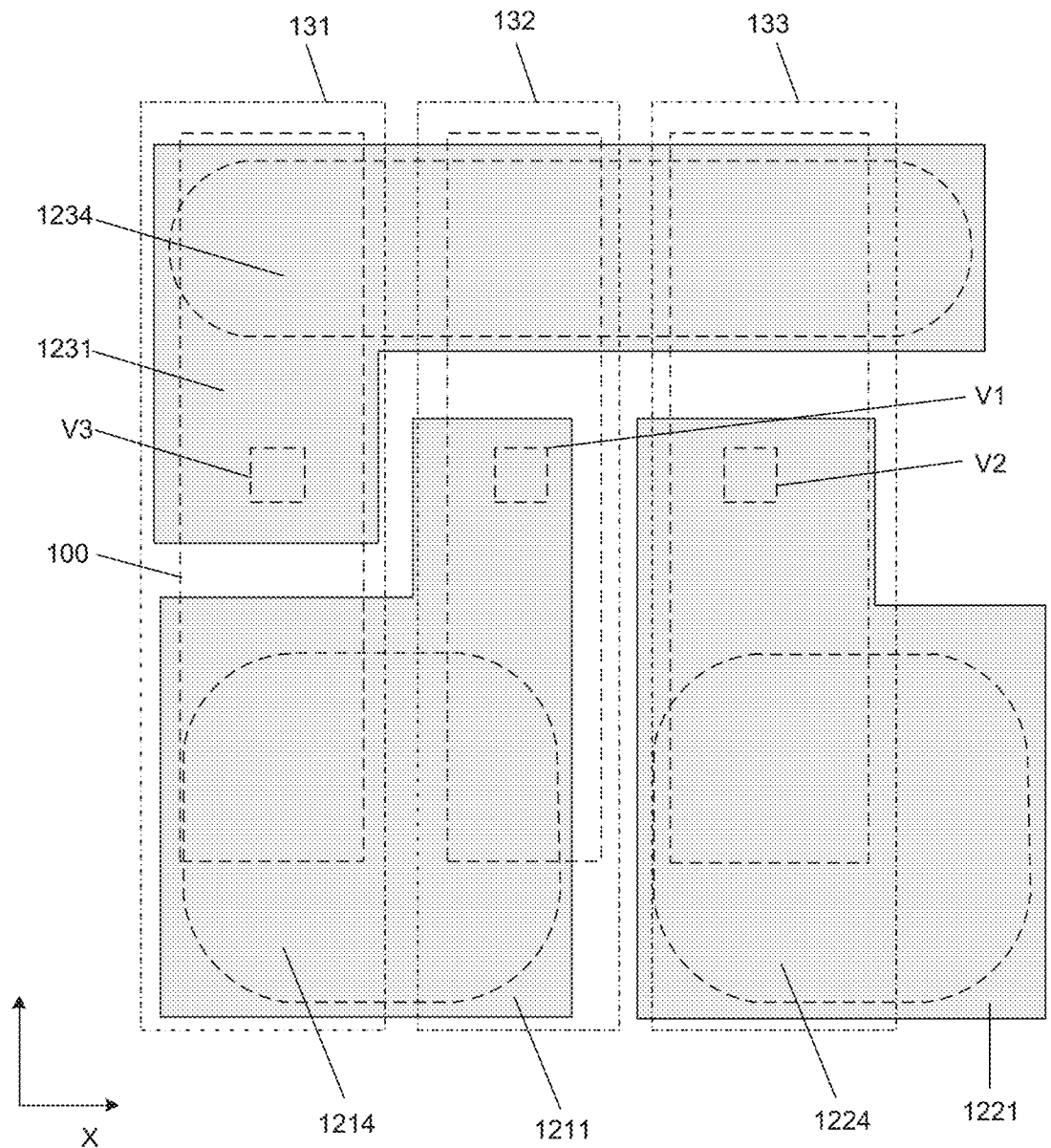
FIG. 5B is a top view illustrating a structure of a pixel area of a display substrate, in accordance with some embodiments of the present disclosure.

As shown in FIG. 5B, the pixel area P' includes a first sub-area 131, a second sub-area 132 and a third sub-area 133 that are arranged sequentially along the first direction X, and each of the first sub-area 131, the second sub-area 132 and the third sub-area 133 is provided with a pixel driver circuit 100 therein.

As shown in FIG. 5B, the first anode 1211 is located in the first sub-area 131 and the second sub-area 132 and is connected to the pixel driver circuit 100 provided in the second sub-area 132. The second anode 1221 is located at least in the third sub-area 133 and is connected to the pixel driver circuit 100 provided in the third sub-area 133. The third anode 1231 is located in the first sub-area 131, the second sub-area 132 and the third sub-area 133, and is connected to the pixel driver circuit 100 provided in the first sub-area 131.

Figure 5C:
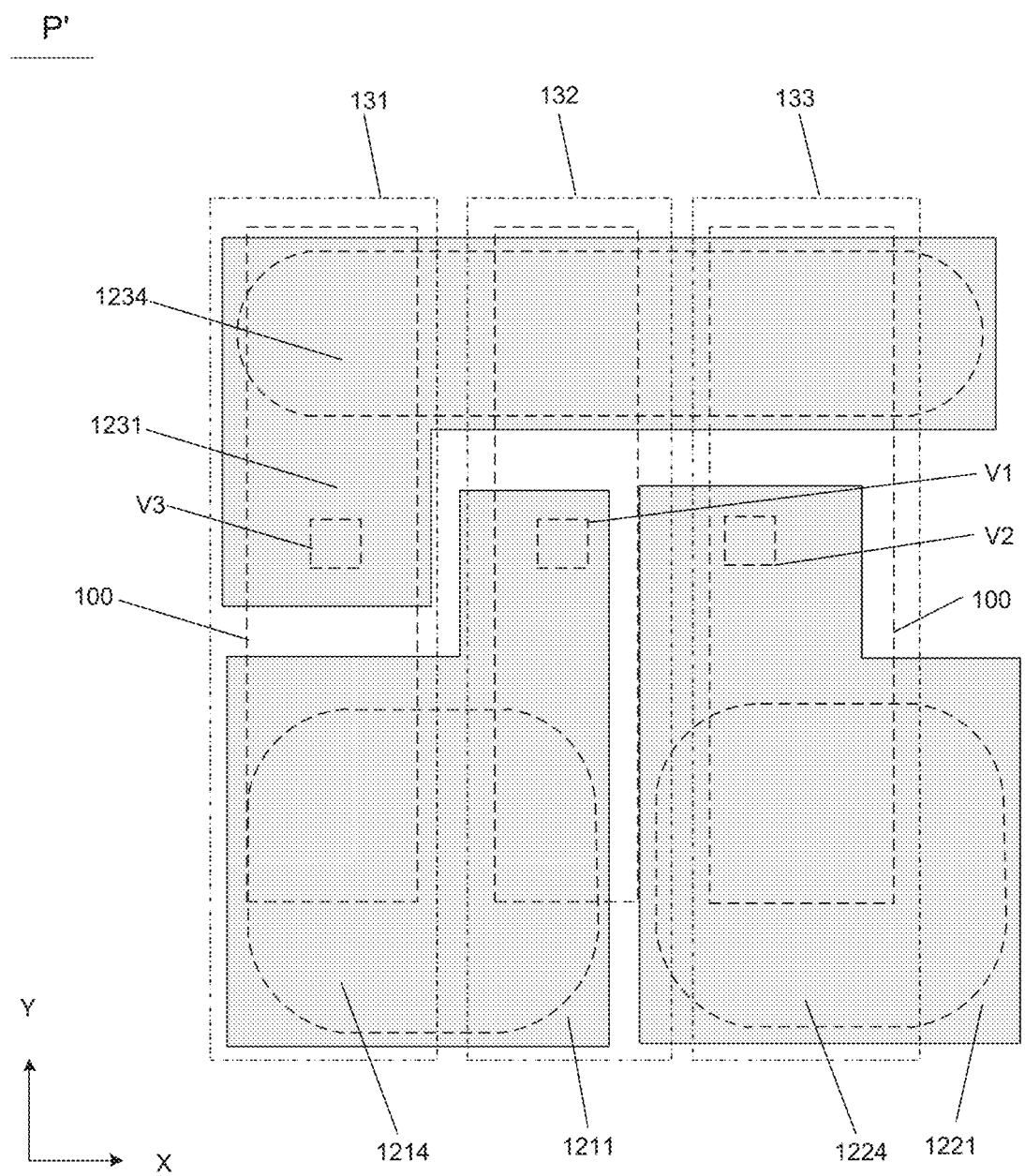
FIG. 5C is a top view illustrating a structure of a pixel area of another display substrate, in accordance with some embodiments of the present disclosure.

In some embodiments, as shown in FIG. 5C, the second anode 1221 further extends into the second sub-area 132.

In some embodiments, as shown in FIG. 5C, the first effective light-emitting area 1214 and the second effective light-emitting area 1224 are symmetrical with respect to a central axis of the third effective light-emitting area 1234 along the second direction Y. In this way, the pixel units P of the display substrate 1000 may be made more symmetrical, which is conducive to improving a uniformity of light emission of the display substrate 1000.

In some embodiments, as shown in FIGS. 5B and 5C, the first anode 1211 is connected to the pixel driver circuit 100 provided in the second sub-area 132 through a first via hole V1, the second anode 1221 is connected to the pixel driver circuit 100 provided in the third sub-area 133 through a second via hole V2, and the third anode 1231 is connected to the pixel driver circuit 100 provided in the first sub-area 131 through a third via hole V3. Orthographic projections of the first via hole V1, the second via hole V2 and the third via hole V3 on the first base 10 are each located between the orthographic projection of the third effective light-emitting area 1234 on the first base 10 and orthographic projections of the first effective light-emitting area 1214 and the second effective light-emitting area 1224 on the first base 10.

In some embodiments, geometric centers of the orthographic projections of the first via hole V1, the second via hole V2 and the third via hole V3 on the first base 10 are on a same straight line along the first direction X.

Figure 6:
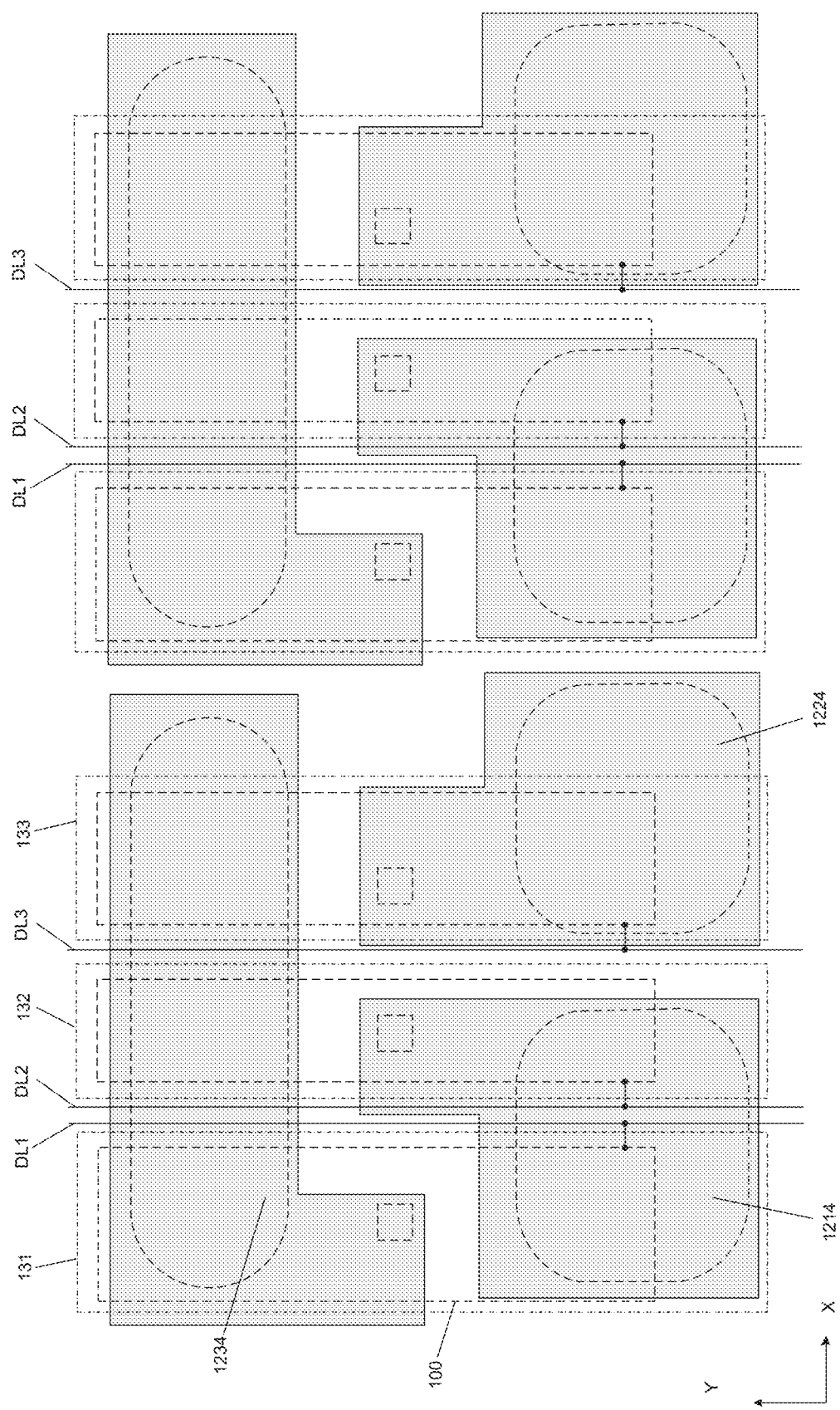
FIG. 6 is a top view illustrating a structure of a pixel area of yet another display substrate, in accordance with some embodiments of the present disclosure.

In some embodiments, as shown in FIG. 6, the display substrate 1000 further includes a plurality of first data lines DL1, a plurality of second data lines DL2 and a plurality of third data lines DL3 that are disposed on the first base 10. The plurality of first data lines DL1, the plurality of second data lines DL2 and the plurality of third data lines DL3 all extend along the second direction Y.

A first data line DL1 and a second data line DL2 are provided between the first sub-area 131 and the second sub-area 132; the first data line DL1 is connected to the pixel driver circuit 100 located in the first sub-area 131, and the second data line DL2 is connected to the pixel driver circuit 100 located in the second sub-area 132. A third data line DL3 is provided between the second sub-area 132 and the third sub-area 133, and the third data line DL3 is connected to the pixel driver circuit 100 located in the third sub-area 133.

The first data line DL1, the second data line DL2 and the third data line DL3 are each connected to a pixel driver circuit 100 in a corresponding sub-area, and are used to supply data signals to respective pixel driver circuits 100 connected thereto, so as to control intensity of light emitted by the light-emitting devices connected to the pixel driver circuits 100. Of course, the first data line DL1, the second data line DL2 and the third data line DL3 are further connected to, for example, a source driver chip, which is used to supply data signals to the first data line DL1, the second data line DL2 and the third data line DL3.

In the display substrate 1000 provided by some embodiments of the present disclosure, the first data line DL1 connected to the pixel driver circuit 100 in the first sub-area 131 and the second data line DL2 connected to the pixel driver circuit 100 in the second sub-area 132 are provided between the first sub-area 131 and the second sub-area 132, and the third data line DL3 connected to the pixel driver circuit 100 in the third sub-area 133 is provided between the second sub-area 132 and the third sub-area 133. In this way, it may be easier to connect the first data line DL1, the second data line DL2 and the third data line DL3 to corresponding pixel driver circuits 100, which facilitates wiring and prevents too many cross-line connections from complicating a manufacturing process of the display substrate 1000.

Figure 7:
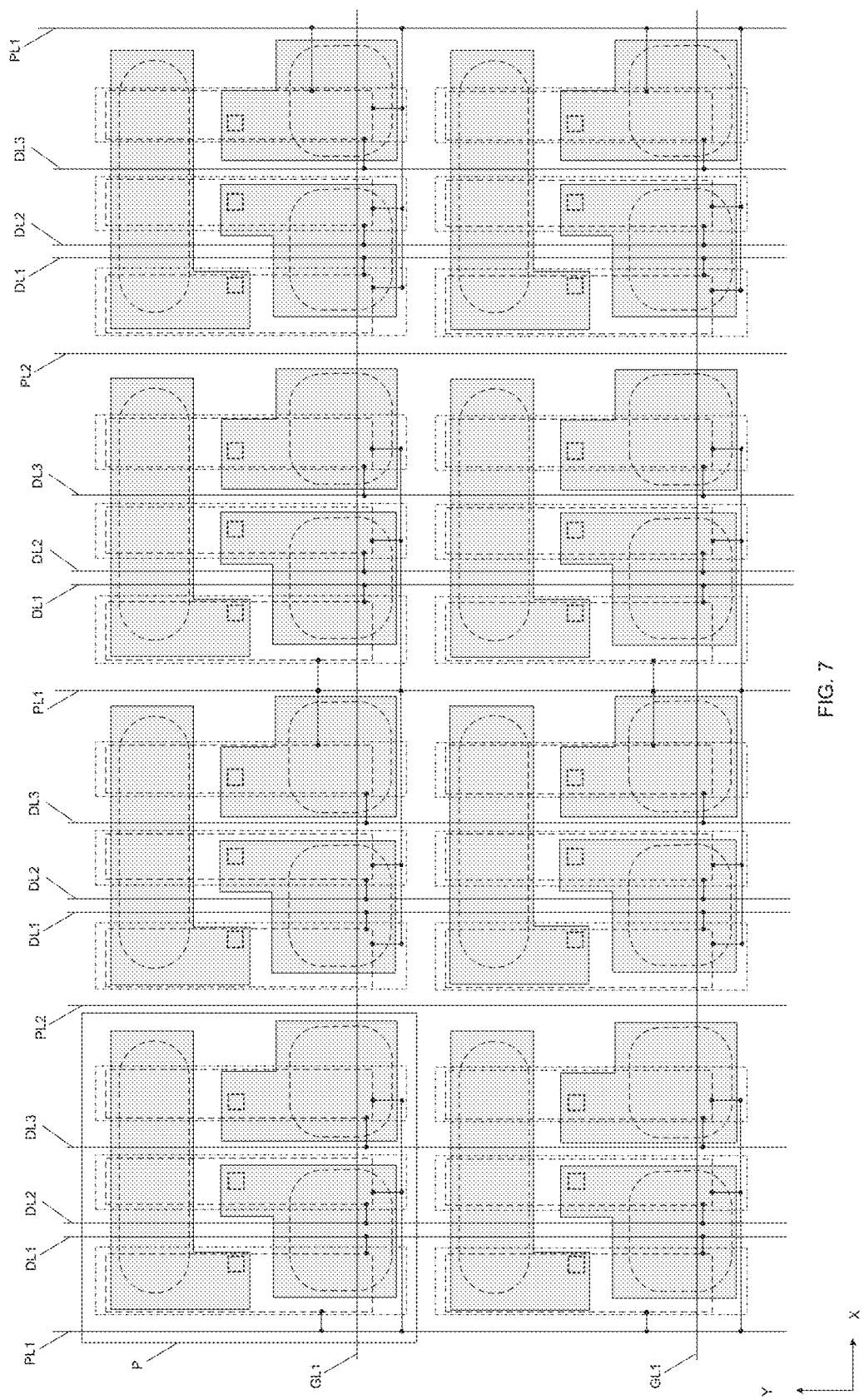
FIG. 7 is a top view illustrating a structure of a pixel area of yet another display substrate, in accordance with some embodiments of the present disclosure.

In some embodiments, as shown in FIG. 7, the display substrate 1000 further includes a plurality of first gate lines GL1, a plurality of first voltage lines PL1 and a plurality of second voltage lines PL2 that are disposed on the first base 10. The plurality of first gate lines GL1 all extend along the first direction X, and the plurality of first voltage lines PL1 and the plurality of second voltage lines PL2 all extend along the second direction Y. The first gate line GL1 is configured to supply a first scan signal to multiple pixel driver circuits 100. For example, each first gate line GL1 corresponds to a row of pixel units P, and the first gate line GL1 is configured to supply a first scan signal to the pixel driver circuits 100 in a corresponding row of pixel units P. The first voltage line PL1 and the second voltage line PL2 are configured to supply a first voltage and a second voltage to pixel driver circuits 100, respectively.

Figure 9:
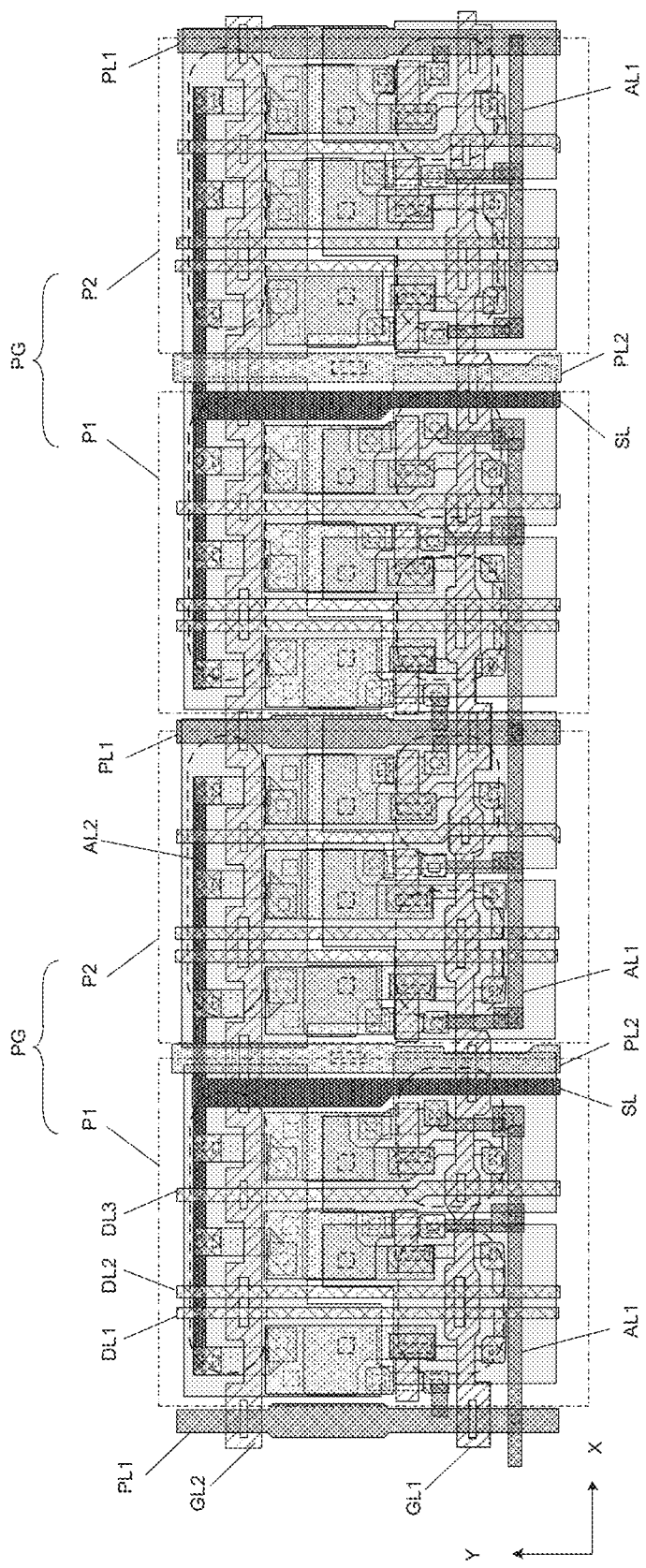
FIG. 9 is a top view illustrating a structure of another display substrate, in accordance with some embodiments of the present disclosure.

In some embodiments, as shown in FIG. 9, along the first direction X, every two adjacent pixel units P constitute a pixel group PG, and two pixel units P of each pixel group PG are a first pixel unit P1 and a second pixel unit P2. A second voltage line PL2 is provided between the first pixel unit P1 and the second pixel unit P2 in the pixel group PG. Along the first direction X, a first voltage line PL1 is provided between two adjacent pixel groups PG.

Along the first direction X, each first voltage line PL1 is connected to pixel driver circuits 100 in a second pixel unit P2 in one of two adjacent pixel groups PG, and is connected to pixel driver circuits 100 in a first pixel unit P1 in the other pixel group PG. In this way, the number of first voltage lines PL1 in the display substrate 1000 may be reduced, thereby simplifying the manufacturing process.

For example, as shown in FIG. 9, the display substrate 1000 further includes a plurality of first auxiliary patterns AL1 disposed on the first base 10. The plurality of first auxiliary patterns AL1 extend along the first direction X, and each first auxiliary pattern AL1 is connected to a first voltage line PL1. The pixel driver circuits 100 in the second pixel unit P2 in one of two adjacent pixel groups PG and the pixel driver circuits 100 in the first pixel unit P1 in the other pixel group PG are connected to a first auxiliary pattern AL1, and are connected to a first voltage line PL1 through the first auxiliary pattern AL1. In this way, it may be possible to prevent too many cross-line connections between the pixel driver circuits 100 and the first voltage lines PL1 from complicating the manufacturing process.

Figure 8:
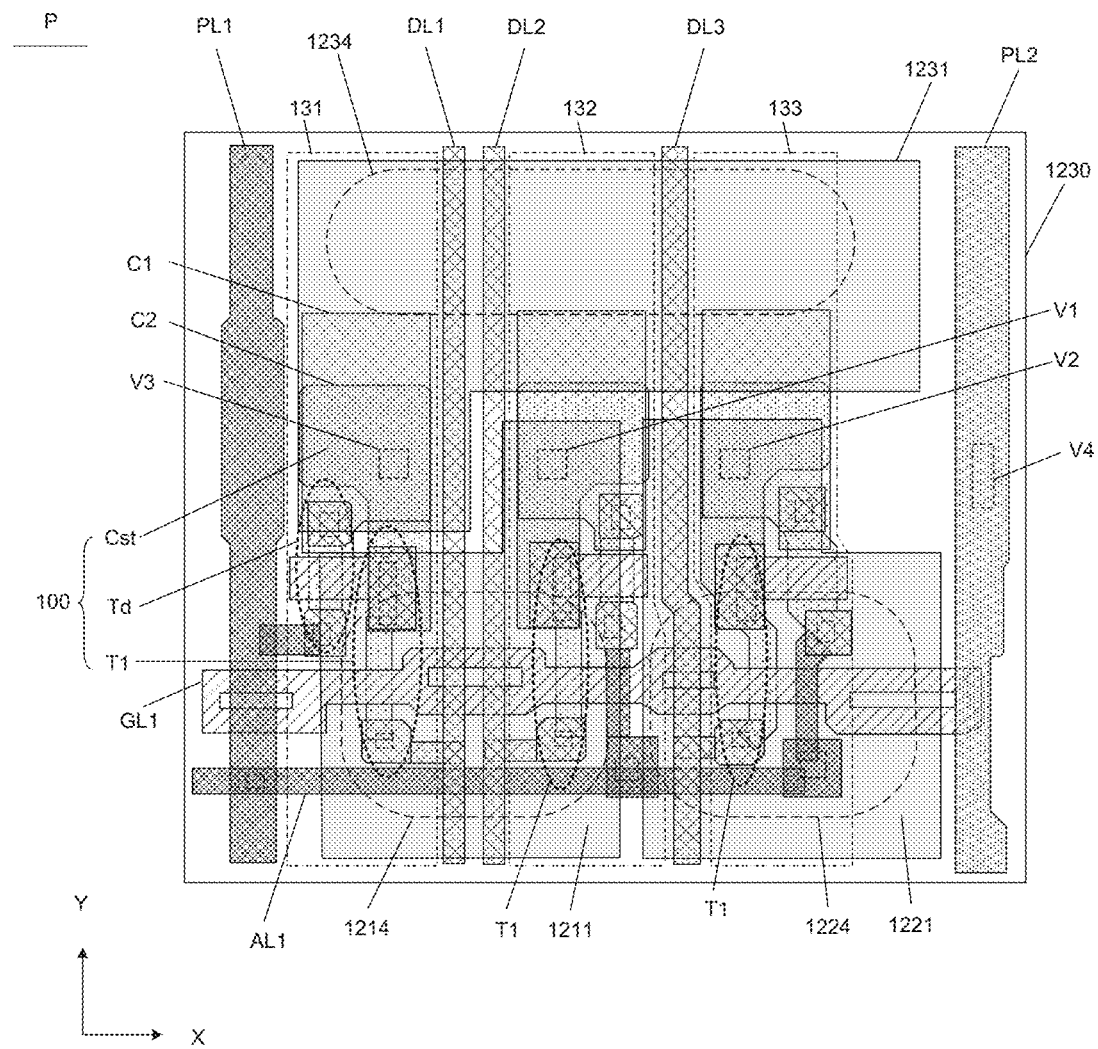
FIG. 8 is a top view illustrating a structure of a display substrate, in accordance with some embodiments of the present disclosure.
Figure 10:
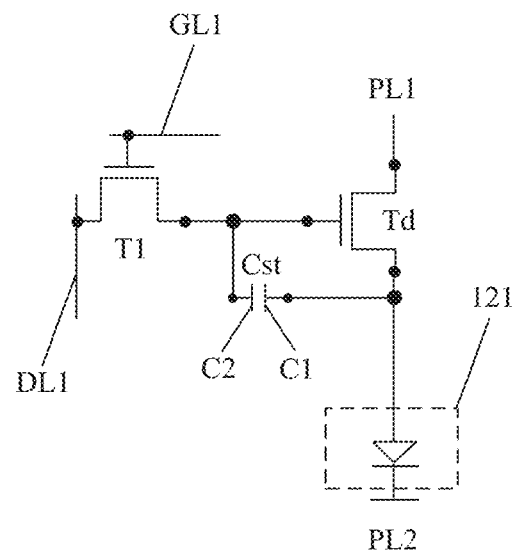
FIG. 10 is a diagram illustrating a structure of a pixel driver circuit of a display substrate, in accordance with some embodiments of the present disclosure.

In some embodiments, as shown in FIG. 8, a pixel driver circuit 100 includes a first transistor T1, a driving transistor Td and a storage capacitor Cst. In this case, the pixel driver circuit has a 2T1C (two transistors and one capacitor) structure. With a pixel driver circuit 100 corresponding to the first light-emitting device 121 as an example, an equivalent circuit of a structure of the pixel driver circuit is as shown in FIG. 10. Herein, the driving transistor Td is used to drive a light-emitting device to emit light. Generally, a width-to-length ratio of a channel of the driving transistor Td is greater than a width-to-length ratio of a channel of another transistor.

The storage capacitor Cst includes a first storage electrode C1 and a second storage electrode C2. As shown in FIG. 8, portions of the first storage electrode C1 and the second storage electrode C2 that are opposite form the storage capacitor Cst.

As shown in FIG. 8, orthographic projections of all storage capacitors Cst in the pixel unit P on the first base 10 are located between the orthographic projection of the third effective light-emitting area 1234 on the first base 10 and the orthographic projections of the first effective light-emitting area 1214 and the second effective light-emitting area 1224 on the first base 10.

A gate of the first transistor T1 is connected to a first gate line GL1 corresponding to the pixel driver circuit 100.

In some embodiments, as shown in FIG. 8, the gate of the first transistor T1 is served by a corresponding first gate line. That is, the gate of the first transistor is a portion of a corresponding first gate line located in a region where the first transistor is located, thereby simplifying the manufacturing process.

As shown in FIG. 8, a first electrode of the first transistor T1 located in the first sub-area 131 is connected to the first data line DL1, a first electrode of the first transistor T1 located in the second sub-area 132 is connected to the second data line DL2, and a first electrode of the first transistor T1 located in the third sub-area 133 is connected to the third data line DL3. Second electrodes of the first transistors T1 are connected to gates of the driving transistors Td, respectively.

Based on this, as shown in FIG. 10, a first scan signal is input from the first gate line GL1, and the first transistor T1 is turned on. After that, a data signal on the first data line DL1 is input to the gate of the driving transistor Td through the first transistor T1, and the first voltage line PL1, the first light-emitting device 121 and the second voltage line PL2 are connected. The first voltage line PL1 supplies a first voltage and the second voltage line PL2 supplies a second voltage, so that the driving transistor Td outputs a driving current and the first light-emitting device 121 emits light under an action of the driving current. In this process, a voltage signal on the first data line DL1 charges the storage capacitor Cst connected to the first transistor T1 that is turned on. When the first scan signal is stopped, electrical energy stored in the storage capacitor Cst may be used to keep the driving transistor Td turned on, so as to maintain the time required for displaying one frame of image.

Figure 11:
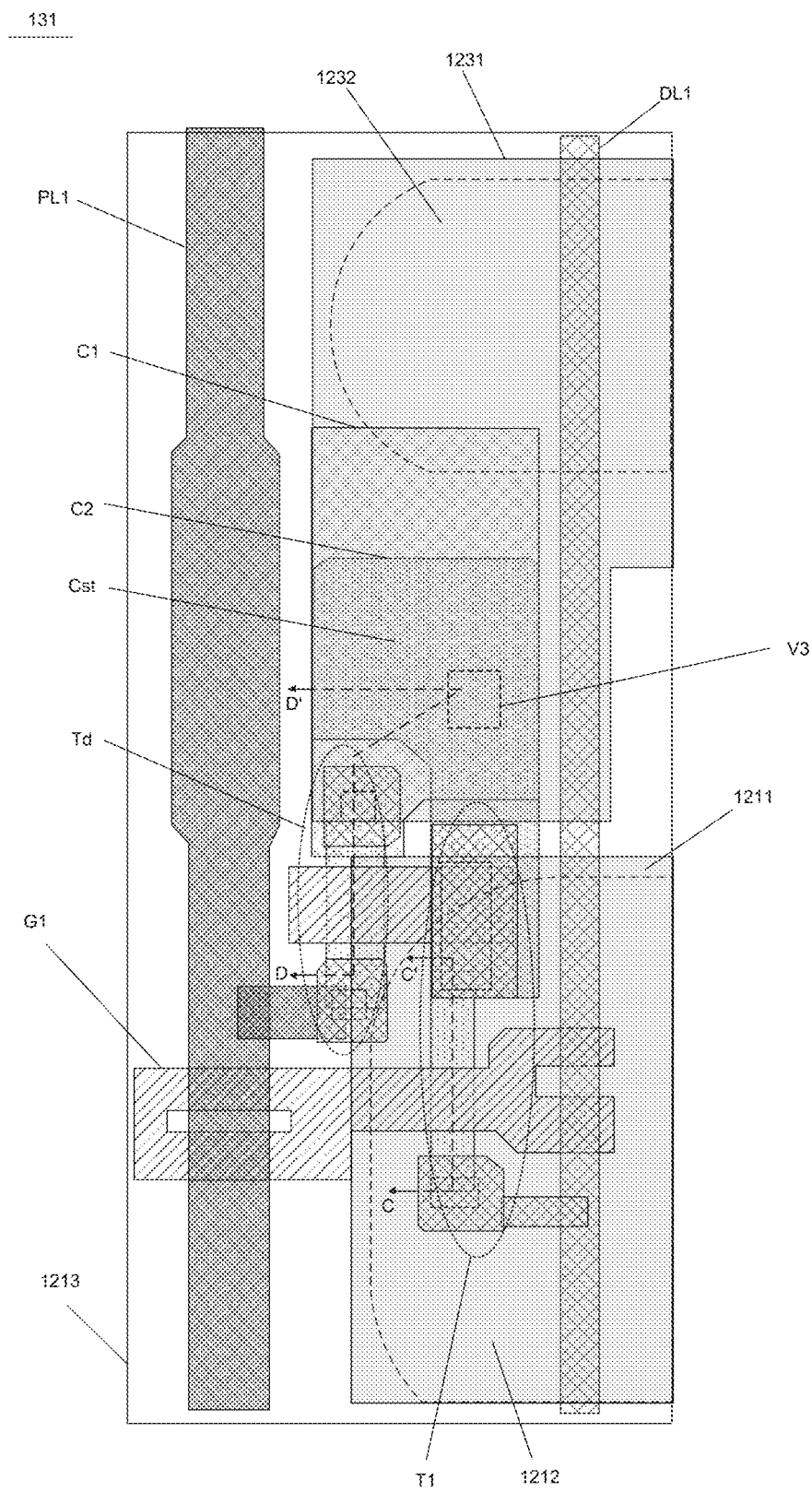
FIG. 11 is a top view illustrating a structure of a first sub-area of a pixel area, in accordance with some embodiments of the present disclosure.
Figure 12:
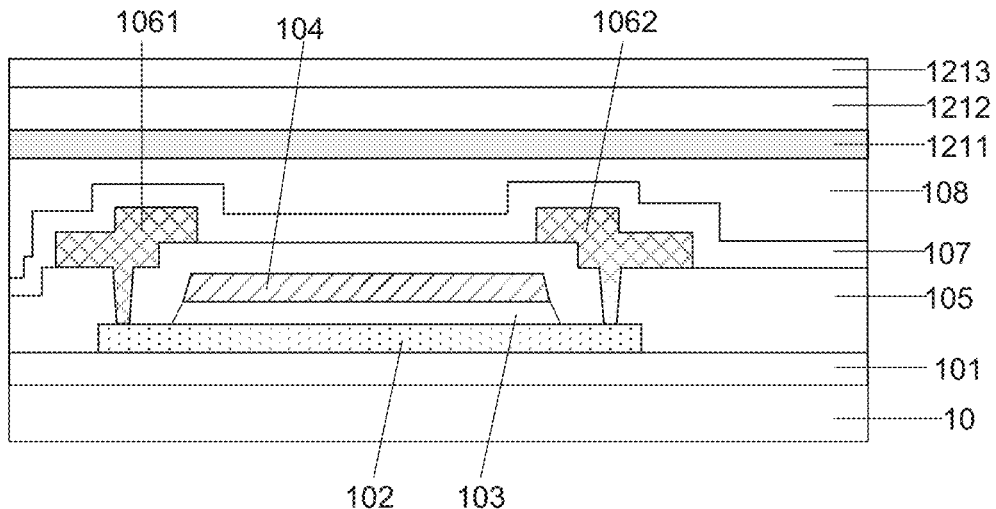
FIG. 12 is a sectional view illustrating a structure of FIG. 11 taken along the C-C' direction.

In some embodiments, as shown in FIGS. 11 and 12, an active pattern 102 of the first transistor T1 is disposed at a side of the gate 104 proximate to the first base 10. A gate insulating pattern 103 is provided between the active pattern 102 of the first transistor T1 and the gate 104 of the first transistor T1. The pixel unit P further includes an interlayer dielectric layer 105. Both the first electrode 1061 and the second electrode 1062 of the first transistor T1 and the gate 104 of the first transistor T1 are located on two sides of the interlayer dielectric layer 105. The first electrode 1061 and the second electrode 1062 of the first transistor T1 are in contact with the active pattern 102 through via holes penetrating the interlayer dielectric layer 105, respectively. In addition, it will be understood that the interlayer dielectric layers 105 of all the pixel units P are an integrative structure.

In some embodiments, as shown in FIG. 12, the pixel unit P further includes a buffer layer 101. The active pattern 102 of the first transistor T1 is located between the buffer layer 101 and the first base 10. The buffer layer 101 is used for preventing impurities in the first base 10 from diffusing into the active pattern 102 of the first transistor T1 and thus affecting a performance of the transistors. In addition, the pixel unit P further includes a passivation layer 107 and a planarization layer 108. The passivation layer 107 is disposed on a side of the first electrode 1061 and the second electrode 1062 of the first transistor T1 away from the first base 10, and the planarization layer 108 is disposed between the passivation layer 107 and the first anode 1211. Herein, the passivation layers 107 of all the pixel units P are an integrative structure, and the planarization layers 108 of all the pixel units P are an integrative structure.

Materials of the buffer layer 101, the gate insulating pattern 103, the interlayer dielectric layer 105 and the passivation layer 107 are, for example, at least one of silicon oxide (SiOx) or silicon nitride (SiNx). A material of the planarization layer 108 is, for example, silicone.

As shown in FIG. 11, the first electrode of the driving transistor Td is connected to a first voltage line PL1 corresponding to the pixel driver circuit 100. For example, the first electrode of the driving transistor Td may be directly connected to the corresponding first voltage line PL1, or may be connected to the first voltage line PL1 through the first auxiliary pattern AL1. A second electrode of the driving transistor Td is connected to the first storage electrode C1.

The second storage electrode C2 is connected to the gate of the driving transistor Td.

Based on this, as shown in FIG. 8, the first storage electrode C1 of the storage capacitor Cst located in the first sub-area 131 is connected to the third anode 1231 through the third via hole V3, the first storage electrode C1 of the storage capacitor Cst located in the second sub-area 132 is connected to the first anode 1211 through the first via hole V1, and the first storage electrode C1 of the storage capacitor Cst in the third sub-area 133 is connected to the second anode 1221 through the second via hole V2. The first cathode 1213, the second cathode 1223 and the third cathode 1233 are connected to a second voltage line PL2 through at least one fourth via hole V4. For example, as shown in FIG. 8, the first cathode 1213, the second cathode 1223 and the third cathode 1233 form an integrated cathode layer 1230, and the cathode layer 1230 is connected to a second voltage line PL2 through at least one fourth via hole V4.

Figure 13:
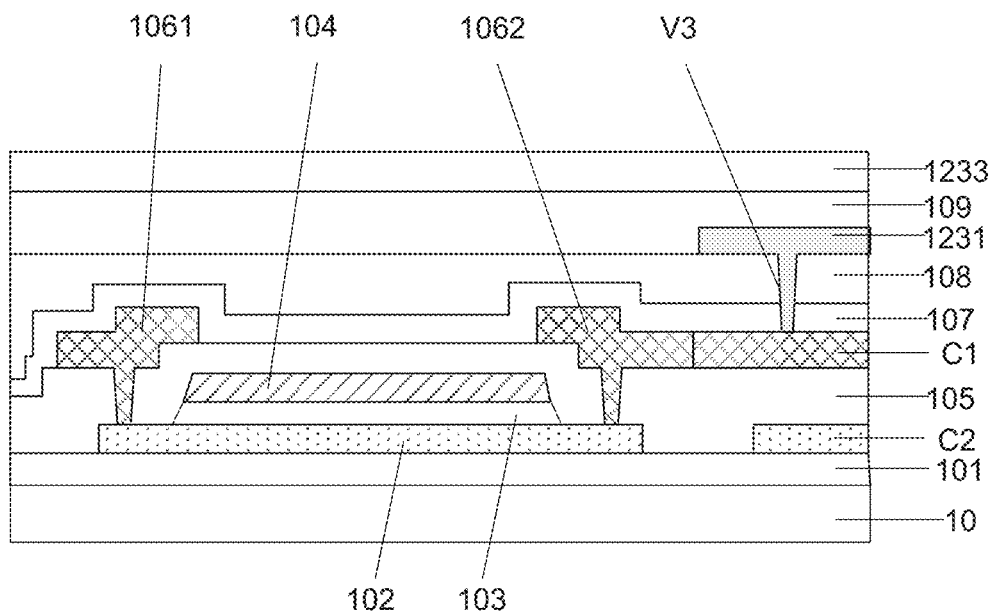
FIG. 13 is a sectional view illustrating a structure of FIG. 11 taken along the D-D' direction.

In some embodiments, as shown in FIGS. 11 and 13, the active pattern 102 of the driving transistor Td is disposed at a side of the gate 104 of the driving transistor Td proximate to the first base 10. A gate insulating pattern 103 is provided between the active pattern 102 of the driving transistor Td and the gate 104 of the driving transistor Td. The first electrode 1061 and the second electrode 1062 of the driving transistor Td are in contact with the active pattern 102 through via holes penetrating the interlayer dielectric layer 105, respectively.

It will be noted that, in embodiments of the present disclosure, the first electrode 1061 is one of a source and a drain of a transistor, and the second electrode 1062 is another of the source and the drain of the transistor. Since the source and the drain of the transistor may be symmetrical in structure, there may be no difference between the source and the drain in structure. That is, there may be no difference between the first electrode 1061 and the second electrode 1062 of the transistor provided in the embodiments of the present disclosure.

In some embodiments, as shown in FIG. 13, the first storage electrode C1 and both the first electrode 1061 and the second electrode 1062 of the driving transistor Td are disposed in a same layer, and are made of a same material. In this way, the first storage capacitor C1 and both the first electrode 1061 and the second electrode 1062 of the driving transistor Td may be manufactured by a same process, thereby simplifying the manufacturing process and reducing the manufacturing cost.

In some embodiments, the first electrode 1061 and the second electrode 1062 of the first transistor T1 may also be disposed in a same layer as the first electrode 1061 and the second electrode 1062 of the driving transistor Td. The gate of the first transistor T1 and the gate of the driving transistor Td are disposed in a same layer. The active pattern of the first transistor T1 and the active pattern of the driving transistor Td are disposed in a same layer.

The second storage electrode C2 and the active pattern 102 of the driving transistor Td are disposed in a same layer. For example, the active pattern 102 is made of indium gallium zinc oxide (IGZO), and the second storage electrode C2 may be obtained by conducting the IGZO. For example, the IGZO may be conducted by a manner of ion implantation, and the ions may be boron ions or phosphorus ions. In some embodiments of the present disclosure, the second storage electrode C2 and the active pattern 102 of the driving transistor Td may be manufactured by a same process, thereby simplifying the manufacturing process and reducing the manufacturing cost.

As shown in FIG. 13, the pixel defining layer 109 is disposed on a side of the planarization layer 108 away from the first base 10. With the third light-emitting device 123 as an example, as shown in FIG. 13, an edge portion of the third anode 1231 of the third light-emitting device 123 is disposed between the planarization layer 108 and the pixel defining layer 109, and the third anode 1231 is connected to the first storage electrode C1 through at least one third via hole V3 penetrating the planarization layer 108 and the passivation layer 107. Of course, edge portions of the second anode 1221 of the first light-emitting device 121 and the second anode 1231 of the second light-emitting device 122 are also disposed between the planarization layer 108 and the pixel defining layer 109.

As shown in FIG. 8, the orthographic projections of the first via hole V1, the second via hole V2 and the third via hole V3 on the first base 10 each overlap with an orthographic projection of a corresponding storage capacitor Cst on the first base 10. The first via hole V1 is used for connecting the first anode 1211 of the first light-emitting device 121 to a first storage electrode C1 of a corresponding storage capacitor Cst, the second via hole V2 is used for connecting the second anode 1221 of the second light-emitting device 122 to a first storage electrode C1 of a corresponding storage capacitor Cst, and the third via hole V3 is used for connecting the third anode 1231 of the third light-emitting device 123 to a first storage electrode C1 of a corresponding storage capacitor Cst.

In some embodiments of the present disclosure, the orthographic projections of all storage capacitors Cst in the pixel unit P on the first base 10 are located between the orthographic projection of the third effective light-emitting area 1234 on the first base 10 and the orthographic projections of the first effective light-emitting area 1214 and the second effective light-emitting area 1224 on the first base 10. Orthographic projections of a first via hole V1 used for connecting the first anode 1211 of each first light-emitting device 121 to a first storage electrode C1 of a corresponding storage capacitor Cst, a second via hole V2 used for connecting a second anode 1221 of each second light-emitting device 122 to a first storage electrode C1 of a corresponding storage capacitor Cst, and a third via hole V3 used for connecting the third anode 1231 of each third light-emitting device 123 to a first storage electrode C1 of a corresponding storage capacitor Cst on the first base 10 overlap with orthographic projections of the corresponding storage capacitors Cst on the first base 10, respectively. That is, the first via hole V1, the second via hole V2 and the third via hole V3 in the pixel unit P are located in an area between the third light-emitting device 123 and both the first light-emitting device 121 and the second light-emitting device 122. In this way, it may be possible to prevent the first via hole V1, the second via hole V2 and the third via hole V3 from affecting the production and display of the light-emitting devices.

Figure 14:
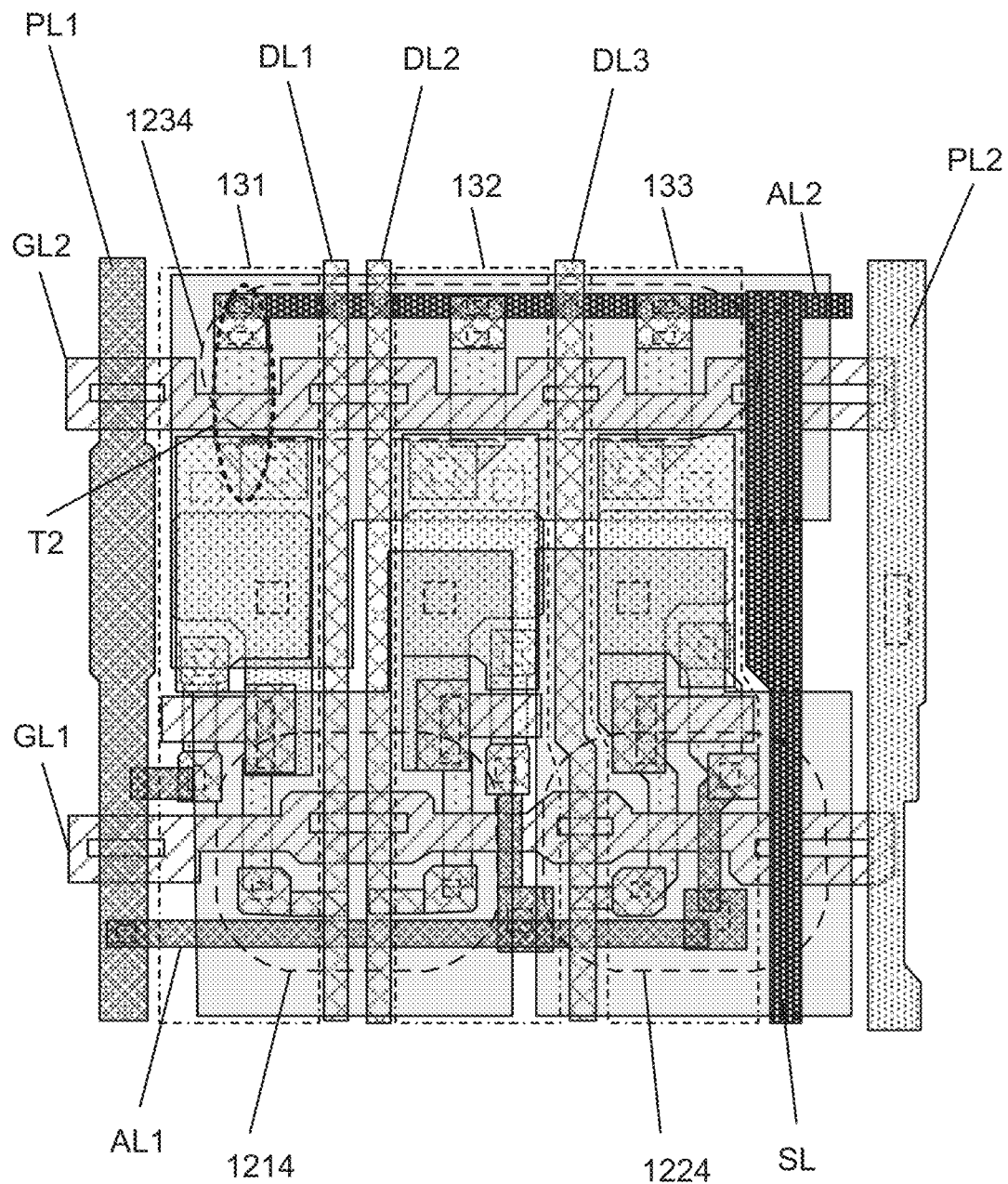
FIG. 14 is a top view illustrating a structure of yet another display substrate, in accordance with some embodiments of the present disclosure.

In some embodiments, as shown in FIGS. 9 and 14, the pixel driver circuit 100 further includes a second transistor T2. The display substrate 1000 further includes a plurality of second gate lines GL2 and a plurality of sensing signal lines SL. The plurality of second gate lines GL2 extend along the first direction X, and the plurality of sensing signal lines SL extend along the second direction.

Figure 15:
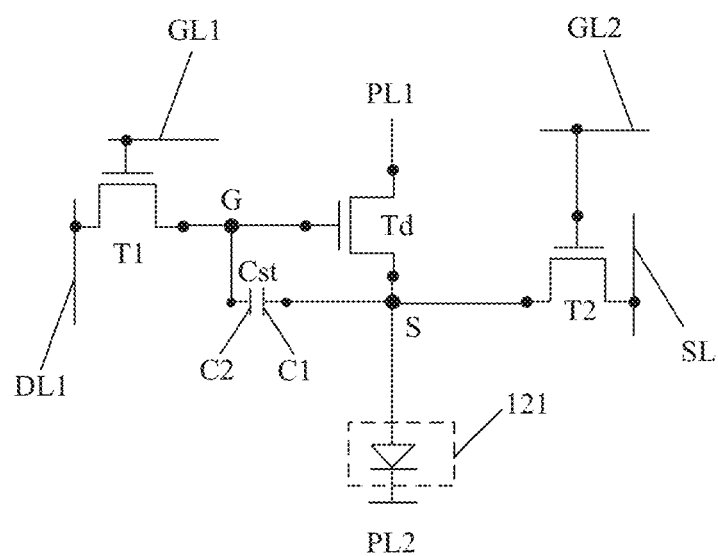
FIG. 15 is a diagram illustrating a structure of a pixel driver circuit of another display substrate, in accordance with some embodiments of the present disclosure.

As shown in FIG. 14, a gate of the second transistor T2 is connected to a corresponding second gate line GL2, a first electrode of the second transistor T2 is connected to a corresponding sensing signal line SL, and a second electrode of the second transistor T2 is connected to a first storage capacitor C1. In this case, the pixel driver circuit has a 3T1C (three transistors and one capacitor) structure. With a pixel driver circuit 100 corresponding to the first light-emitting device 121 as an example, a structure of the pixel driver circuit is schematically shown in FIG. 15.

The sensing signal line SL is configured to sense electrical signals in the pixel driver circuit 100. As shown in FIG. 15, during signal sensing, a first scan signal is input from a first gate line GL1, and the first transistor T1 is turned on. At the same time, a second scan signal is input from a second gate line GL2, and the second transistor T2 is turned on. The data line DL1 supplies a data signal to a first node G through the first transistor T1, and the sensing signal line SL senses a voltage transmitted to a second node S through the second transistor T2. When the voltage at the second node S is stable, a threshold voltage of the driving transistor Td may be obtained by comparing a voltage of the data signal and a voltage at second node S. In this way, the threshold voltage of the driving transistor Td may be compensated externally, thereby avoiding uneven display caused by a drift of the threshold voltage of the driving transistor Td due to material, process, and other reasons.

As shown in FIG. 9, a sensing signal line SL is provided between the first pixel unit P1 and the second pixel unit P2 in the pixel group PG. The sensing signal line SL is connected to the pixel driver circuit 100 in the first pixel unit P1 and the pixel driver circuit 100 in the second pixel unit P2 of the pixel group PG.

Based on this, as shown in FIG. 9, in some embodiments, an orthographic projection of the second light-emitting device 122 in the first pixel unit P1 of the pixel group PG on the first base 10 has an overlapping area with orthographic projections of the second voltage line PL2 and the sensing signal line SL on the first base 10. An orthographic projection of the second light-emitting device 122 in the second pixel unit P2 of the pixel group PG on the first base 10 has an overlapping area with an orthographic projection of the first voltage line PL1 on the first base 10.

In some embodiments, as shown in FIG. 9, the display substrate 1000 further includes a plurality of second auxiliary patterns AL2 that are disposed on the first base 10. The plurality of second auxiliary patterns AL2 extend along the first direction X, and each second auxiliary pattern AL2 is connected to a sensing signal line SL. All the pixel driver circuits 100 in each pixel group PG are connected to a single second auxiliary pattern AL2, and are connected to a single sensing signal line SL through the second auxiliary pattern AL2. In this way, it may be possible to prevent too many cross-line connections between the pixel driver circuits 100 and the sensing signal line SL from complicating the manufacturing process.

In some embodiments, as shown in FIGS. 9 and 14, the gate of the second transistor T2 is served by the second gate line GL2 connected to the gate of the second transistor T2. That is, the gate of the second transistor is a portion of a corresponding second gate line located in a region where the second transistor is located. In this way, the manufacturing process may be simplified and the manufacturing cost may be saved.

In some embodiments, as shown in FIGS. 9 and 14, an orthographic projection of the third light-emitting device 123 on the first base 10 has an overlapping area with an orthographic projection of the second transistor T2 on the first base 10.

In some embodiments, the plurality of first data line DL1, the plurality of second data lines DL2, the plurality of third data lines DL3, the plurality of first voltage lines PL1, the plurality of second voltage lines PL2 and the plurality of sensing signal lines SL are disposed in a same layer and are made of a same material. In this way, these lines may be manufactured by a same process, thereby simplifying the manufacturing process and saving the manufacturing cost.

It will be noted that, in a case where the plurality of first data line DL1, the plurality of second data lines DL2, the plurality of third data lines DL3, the plurality of first voltage lines PL1, the plurality of second voltage lines PL2 and the plurality of sensing signal lines SL are disposed in the same layer, the first auxiliary pattern AL1 and the corresponding first voltage line PL1 are disposed in different layers and are connected through a via hole; the second auxiliary pattern AL2 and the corresponding sensing signal line SL are disposed in different layers and are connected through a via hole. In this way, it may be possible to avoid short circuits between the first auxiliary pattern AL1 and the first data line DL1, the second data line DL2 or the third data line DL3, and between the second auxiliary pattern AL2 and the first data line DL1, the second data line DL2, the third data line DL3 or the second voltage line PL2.

For example, materials of the plurality of first data line DL1, the plurality of second data lines DL2, the plurality of third data lines DL3, the plurality of first voltage lines PL1, the plurality of second voltage lines PL2 and the plurality of sensing signal lines SL include at least one of copper element, aluminum element, silver element, copper alloy, aluminum alloy or silver alloy.

Figure 2A:
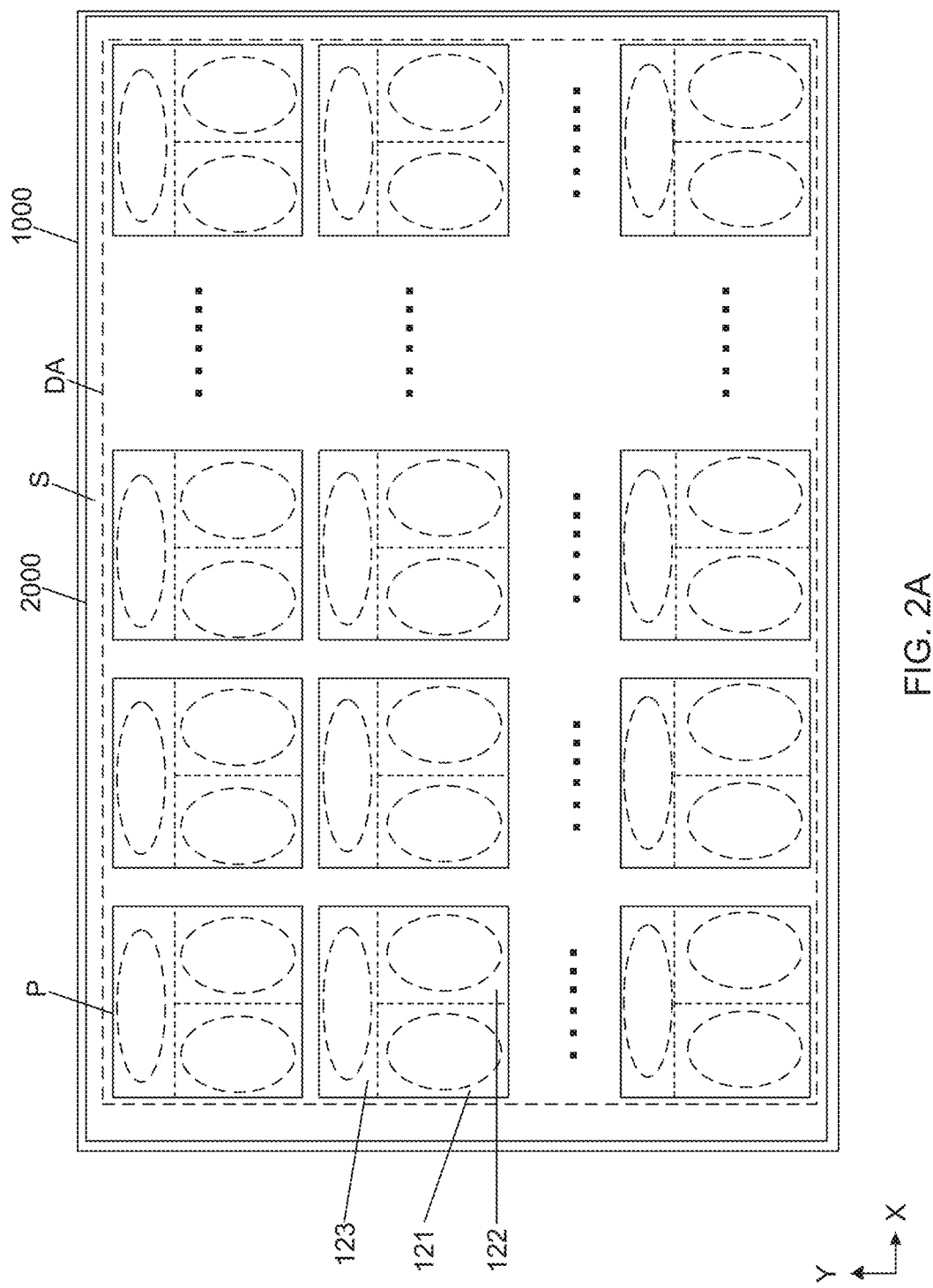
FIG. 2A is a top view illustrating a structure of a display apparatus, in accordance with some embodiments of the present disclosure.

As for the display apparatus, based on the display substrate 1000 as described above, as shown in FIGS. 2A and 2B, the display apparatus further includes a color filter substrate 2000. The color filter substrate 2000 includes a second base 20 and a color filter layer 210 disposed on a side of the second base 20 facing the first base 10.

The color filter layer 210 includes a plurality of first color filter units 211, a plurality of second color filter units 212 and a plurality of third color filter units 213. A portion of a black matrix 220 is provided between two adjacent filter units. An orthographic projection of each first color filter unit 211 on the second base 20 overlaps with an orthographic projection of a corresponding first light-emitting device 121 on the second base 20, an orthographic projection of each second color filter unit 212 on the second base 20 overlaps with an orthographic projection of a corresponding second light-emitting device 122 on the second base 20, and an orthographic projection of each third color filter unit 213 on the second base 20 overlaps with an orthographic projection of a corresponding third light-emitting device 123 on the second base 20.

In some examples, the second base 20 is a cover glass.

Figure 2B:
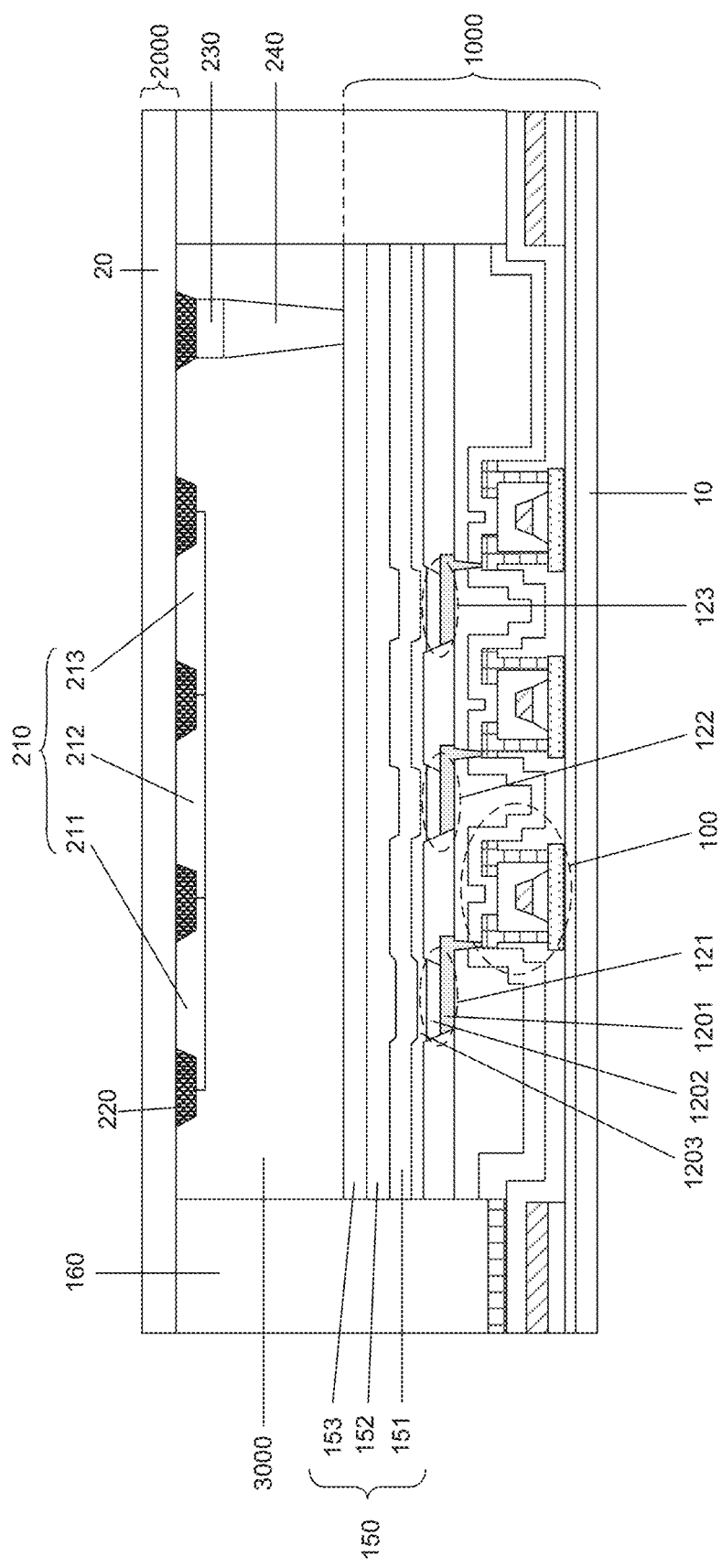
FIG. 2B is a diagram illustrating a structure of a display apparatus, in accordance with some embodiments of the present disclosure.

As shown in FIG. 2B, a cushion gum layer 230 is disposed on a side of at least part of the black matrix 220 facing the display substrate 1000, and post spacers (PS) 240 are provided on a side of the cushion gum layer 230 facing the display substrate 1000. The post spacers 240 are used for preventing the display apparatus from being deformed when subjected to external pressure which affects the display effect. The cushion gum layer 230 may play a buffering role when the display apparatus is subjected to external pressure.

In some embodiments, the display apparatus further includes a filling adhesive 3000 provided between the display substrate 1000 and the color filter substrate 2000.

The filling adhesive 3000 is filled between the display substrate 1000 and the color filter substrate 2000. The filling adhesive 3000 may be able to relieve the external pressure of the display apparatus, prevent the display apparatus from being damaged by pressure, and further block water and oxygen.

The display apparatuses include a television, a cellphone, a display panel, and the like.

The forgoing descriptions are merely specific implementations of the present disclosure, but the protection scope of the present disclosure is not limited thereto. Any person skilled in the art could conceive of changes or replacements within the technical scope of the present disclosure, which shall be included in the protection scope of the present disclosure. Therefore, the protection scope of the present disclosure shall be subject to the protection scope of the claims.

What is claimed is:

1. A display substrate, comprising:
a first base; and
a plurality of pixel units disposed on the first base, the plurality of pixel units being arranged in rows along a first direction and in columns along a second direction; a pixel unit in the plurality of pixel units having a first effective light-emitting area, a second effective light-emitting area and a third effective light-emitting area, wherein the pixel unit includes:
a plurality of light-emitting devices, the plurality of light-emitting devices including a first light-emitting device, a second light-emitting device and a third light-emitting device; a portion of the first light-emitting device being disposed in the first effective light-emitting area, a portion of the second light-emitting device being disposed in the second effective light-emitting area, and a portion of the third light-emitting device being disposed in the third effective light-emitting area; the first light-emitting device, the second light-emitting device and the third light-emitting device being configured to emit light of three primary colors, wherein
the first effective light-emitting area and the second effective light-emitting area are arranged at intervals along the first direction, and the third effective light-emitting area is spaced apart from both the first effective light-emitting area and the second effective light-emitting area along the second direction; a minimum distance between the first effective light-emitting area and the second effective light-emitting area along the first direction is less than a minimum distance between the third effective light-emitting area and both the first effective light-emitting area and the second effective light-emitting area along the second direction.

2. The display substrate according to claim 1, wherein the minimum distance between the first effective light-emitting area and the second effective light-emitting area is approximately 10 μm to approximately 20 μm, and the minimum distance between the third effective light-emitting area and both the first effective light-emitting area and the second effective light-emitting is approximately 20 μm to approximately 25 μm.

3. The display substrate according to claim 1, wherein the third light-emitting device is configured to emit green light; and the first light-emitting device and the second light-emitting device are configured to emit red light and blue light, respectively.

4. The display substrate according to claim 1, wherein the first light-emitting device includes a first anode, a first light-emitting functional layer and a first cathode; the second light-emitting device includes a second anode, a second light-emitting functional layer and a second cathode; and the third light-emitting device includes a third anode, a third light-emitting functional layer and a third cathode; and
the pixel unit further includes a plurality of pixel driver circuits; the first anode, the second anode and the third anode are each connected to a corresponding pixel driver circuit, and a pixel driver circuit is configured to drive a corresponding light-emitting device to emit light; the pixel driver circuit includes a storage capacitor, wherein
orthographic projections of all storage capacitors in the pixel unit on the first base are located between an orthographic projection of the third effective light-emitting area on the first base and orthographic projections of the first effective light-emitting area and the second effective light-emitting area on the first base.

5. The display substrate according to claim 4, wherein the display substrate has a display area; the display area includes a plurality of pixel areas, and an area where the pixel unit is located is a pixel area;
the pixel area includes a first sub-area, a second sub-area and a third sub-area that are arranged sequentially along the first direction, and each of the first sub-area, the second sub-area and the third sub-area is provided with a pixel driver circuit therein; and
the first anode is disposed in the first sub-area and the second sub-area and is connected to a pixel driver circuit provided in the second sub-area; the second anode is disposed at least in the third sub-area and is connected to a pixel driver circuit provided in the third sub-area; the third anode is disposed in the first sub-area, the second sub-area and the third sub-area, and is connected to a pixel driver circuit provided in the first sub-area.

6. The display substrate according to claim 5, wherein the second anode further extends to the second sub-area.

7. The display substrate according to claim 5, wherein the first anode is connected to the pixel driver circuit provided in the second sub-area through a first via hole, the second anode is connected to the pixel driver circuit provided in the third sub-area through a second via hole, and the third anode is connected to the pixel driver circuit provided in the first sub-area through a third via hole; orthographic projections of the first via hole, the second via hole and the third via hole on the first base are each located between the orthographic projection of the third effective light-emitting area on the first base and the orthographic projections of the first effective light-emitting area and the second effective light-emitting area on the first base.

8. The display substrate according to claim 7, wherein geometric centers of the orthographic projections of the first via hole, the second via hole and the third via hole in the pixel unit on the first base are on a same straight line along the first direction.

9. The display substrate according to claim 7, further comprising a plurality of first data lines, a plurality of second data lines and a plurality of third data lines that are disposed on the first base, and the plurality of first data lines, the plurality of second data lines and the plurality of third data lines all extending along the second direction;
a first data line and a second data line are disposed between the first sub-area and the second sub-area; the first data line is connected to the pixel driver circuit located in the first sub-area, and the second data line is connected to the pixel driver circuit located in the second sub-area; and
a third data line is disposed between the second sub-area and the third sub-area, and the third data line is connected to the pixel driver circuit located in the third sub-area.

10. The display substrate according to claim 9, further comprising a plurality of first gate lines, a plurality of first voltage lines and a plurality of second voltage lines, the plurality of first gate lines all extending along the first direction, and the plurality of first voltage lines and the plurality of second voltage lines all extending along the second direction, wherein
a pixel driver circuit in each of the first sub-area, the second sub-area and the third sub-area includes a first transistor, a driving transistor and a storage capacitor; and the storage capacitor includes a first storage electrode and a second storage electrode;
a gate of the first transistor is connected to a first gate line corresponding to the pixel driver circuit; a second electrode of the first transistor is connected to a gate of the driving transistor; a first electrode of a first transistor located in the first sub-area is connected to the first data line, a first electrode of a first transistor located in the second sub-area is connected to the second data line, and a first electrode of a first transistor located in the third sub-area is connected to the third data line;
a first electrode of the driving transistor is connected to a first voltage line corresponding to the pixel driver circuit, and a second electrode of the driving transistor is connected to the first storage electrode; a first storage electrode of the storage capacitor in the first sub-area is connected to the third anode through the third via hole, a first storage electrode of the storage capacitor in the second sub-area is connected to the first anode through the first via hole, and a first storage electrode of the storage capacitor in the third sub-area is connected to the second anode through the second via hole; the first cathode, the second cathode and the third cathode are connected to a second voltage line through at least one fourth via hole;
the second storage electrode is connected to the gate of the driving transistor; and
the orthographic projections of the first via hole, the second via hole and the third via hole on the first base overlap with orthographic projections of corresponding storage capacitors on the first base, respectively.

11. The display substrate according to claim 10, wherein
the driving transistor further includes an active pattern, and the active pattern is disposed on a side of the gate of the driving transistor proximate to the first base;
the first storage electrode is disposed in a same layer as the first electrode and the second electrode of the driving transistor; and
the second storage electrode is disposed in a same layer as the active pattern of the driving transistor.

12. The display substrate according to claim 10, wherein the gate of the first transistor is a portion of a corresponding first gate line located in a region where the first transistor is located.

13. The display substrate according to claim 10, wherein along the first direction, every two adjacent pixel units constitute a pixel group, and the two pixel units of each pixel group are a first pixel unit and a second pixel unit;
a second voltage line is disposed between the first pixel unit and the second pixel unit in the pixel group; and
along the first direction, a first voltage line is disposed between two adjacent pixel groups.

14. The display substrate according to claim 13, wherein the pixel driver circuit further includes a second transistor;
the display substrate further includes a plurality of second gate lines and a plurality of sensing signal lines; the plurality of second gate lines extend along the first direction, and the plurality of sensing signal lines extend along the second direction; and a sensing signal line is disposed between the first pixel unit and the second pixel unit in the pixel group;
a gate of the second transistor is connected to a corresponding second gate line; a first electrode of the second transistor is connected to a corresponding sensing signal line, and a second electrode of the second transistor is connected to the first storage electrode.

15. The display substrate according to claim 14, wherein the gate of the second transistor is a portion of a corresponding second gate line located in a region where the second transistor is located.

16. The display substrate according to claim 14, wherein an orthographic projection of the third light-emitting device on the first base has an overlapping area with orthographic projections of the second transistors located in the first to third sub-areas on the first base.

17. The display substrate according to claim 14, wherein an orthographic projection of the second light-emitting device in the first pixel unit of the pixel group on the first base has an overlapping area with orthographic projections of the second voltage line and the sensing data line on the first base; and an orthographic projection of the second light-emitting device in the second pixel unit of the pixel group on the first base has an overlapping area with an orthographic projection of the first voltage line on the first base.

18. The display substrate according to claim 14, wherein
the plurality of first data lines, the plurality of second data lines, the plurality of third data lines, the plurality of first voltage lines, the plurality of second voltage lines and the plurality of sensing data lines are disposed in a same layer.

19. The display substrate according to claim 1, wherein the first effective light-emitting area and the second effective light-emitting area are symmetrical with respect to a central axis of the third effective light-emitting area along the second direction.

20. A display apparatus comprising the display substrate according to claim 1, the display apparatus further comprising:
a color filter substrate including a second base and a color filter layer disposed on a side of the second base facing the first base, wherein
the color filter layer includes a plurality of first color filter units, a plurality of second color filter units and a plurality of third color filter units; a portion of a black matrix is disposed between two adjacent filter units;
an orthographic projection of each first color filter unit on the second base overlaps with an orthographic projection of a corresponding first light-emitting device on the second base, an orthographic projection of each second color filter unit on the second base overlaps with an orthographic projection of a corresponding second light-emitting device on the second base, and an orthographic projection of each third color filter unit on the second base overlaps with an orthographic projection of a corresponding third light-emitting device on the second base.

* * * * *